United States Patent
Rickman et al.

(10) Patent No.: US 9,270,078 B2
(45) Date of Patent: Feb. 23, 2016

(54) TUNABLE SOI LASER

(71) Applicant: Rockley Photonics Limited, Marlborough Wiltshire (GB)

(72) Inventors: Andrew Rickman, Marlborough (GB); Aaron John Zilkie, Pasadena, CA (US)

(73) Assignee: Rockley Photonics Limited, London (GB)

( * ) Notice: Subject to any disclaimer, the term of this patent is extended or adjusted under 35 U.S.C. 154(b) by 0 days.

(21) Appl. No.: 14/601,107

(22) Filed: Jan. 20, 2015

(65) Prior Publication Data

US 2015/0207291 A1 Jul. 23, 2015

(30) Foreign Application Priority Data

Jan. 20, 2014 (GB) .................................. 1400909.6

(51) Int. Cl.
*H01S 3/10* (2006.01)
*H01S 3/106* (2006.01)
(Continued)

(52) U.S. Cl.
CPC ............... *H01S 3/1062* (2013.01); *H01S 3/083* (2013.01); *H01S 3/08027* (2013.01);
(Continued)

(58) Field of Classification Search
CPC ... H01S 3/1062; H01S 3/106; H01S 3/08027; H01S 3/083; H01S 3/10053; H01S 5/142; H01S 5/14; H01S 5/125; H01S 5/021; H01S 5/1007; H01S 5/1071; H01S 5/1209
USPC ................................................. 372/20, 94, 97
See application file for complete search history.

(56) References Cited

U.S. PATENT DOCUMENTS 4,896,325 A 1/1990 Coldren
5,379,354 A 1/1995 Jenkins
(Continued)

FOREIGN PATENT DOCUMENTS

EP 0 310 058 A2 4/1989
EP 1 300 918 A2 4/2003
(Continued)

OTHER PUBLICATIONS

Partial International Search for Patent Application No. PCT/GB2015/050105, Mailed May 4, 2015, Received May 11, 2015, 6 Pages.
(Continued)

*Primary Examiner* — Kinam Park
(74) *Attorney, Agent, or Firm* — Lewis Roca Rothgerber Christie LLP

(57) ABSTRACT

A wavelength tunable silicon-on-insulator (SOI) laser comprising: a laser cavity including: a semiconductor gain medium having a front end and a back end, wherein a mirror of the laser cavity is located at the back end of the semiconductor gain medium; and a phase-tunable waveguide platform coupled to the front end of the semiconductor gain medium, the phase-tunable waveguide platform comprising: a first resonator and a second resonator; at least one resonator being a phase-tunable resonator; wherein the first resonator is any one of: an MMI device including a pair of reflective surfaces defining a resonator cavity therebetween such that the device is configured to act as a Fabry-Perot filter; a ring resonator; or a waveguide Fabry-Perot filter; and wherein the second resonator is any one of: an MMI device including a pair of reflective surfaces defining a resonator cavity therebetween such that the device is configured to act as a Fabry-Perot filter; a ring resonator; or a waveguide Fabry-Perot filter.

25 Claims, 13 Drawing Sheets

(51) Int. Cl.
*H01S 3/083* (2006.01)
*H01S 5/14* (2006.01)
*H01S 3/08* (2006.01)
*H01S 5/02* (2006.01)
*H01S 5/10* (2006.01)
*H01S 5/125* (2006.01)
*H01S 3/105* (2006.01)
*H01S 5/028* (2006.01)
*H01S 5/12* (2006.01)
*G02B 6/12* (2006.01)

(52) U.S. Cl.
CPC ............ *H01S 3/10053* (2013.01); *H01S 5/021* (2013.01); *H01S 5/1007* (2013.01); *H01S 5/1071* (2013.01); *H01S 5/125* (2013.01); *H01S 5/14* (2013.01); *H01S 5/142* (2013.01); *G02B 6/12007* (2013.01); *H01S 3/105* (2013.01); *H01S 3/106* (2013.01); *H01S 5/028* (2013.01); *H01S 5/1209* (2013.01)

(56) References Cited

U.S. PATENT DOCUMENTS

| | | | |
|---|---|---|---|
| 5,396,570 | A | 3/1995 | Jenkins et al. |
| 5,757,986 | A | 5/1998 | Crampton et al. |
| 5,987,050 | A | 11/1999 | Doerr et al. |
| 6,101,210 | A * | 8/2000 | Bestwick ............ H01S 5/02248 359/27 |
| 6,108,478 | A | 8/2000 | Harpin et al. |
| 6,298,177 | B1 | 10/2001 | House |
| 6,571,038 | B1 | 5/2003 | Joyner et al. |
| 6,728,279 | B1 | 4/2004 | Sarlet et al. |
| 6,768,827 | B2 | 7/2004 | Yoo |
| 6,873,763 | B2 | 3/2005 | Nikonov |
| 7,072,542 | B2 | 7/2006 | Jenkins et al. |
| 7,145,923 | B2 | 12/2006 | Carter et al. |
| 7,505,686 | B2 | 3/2009 | Jennen |
| 7,885,492 | B2 | 2/2011 | Welch et al. |
| 8,295,315 | B2 | 10/2012 | Ward et al. |
| 8,346,028 | B2 | 1/2013 | Feng et al. |
| 8,368,995 | B2 | 2/2013 | Dallesasse et al. |
| 8,559,470 | B2 | 10/2013 | Dallesasse et al. |
| 8,724,988 | B2 | 5/2014 | Andriolli et al. |
| 2003/0123784 | A1 | 7/2003 | Mukai |
| 2004/0190562 | A1 | 9/2004 | Nakano et al. |
| 2008/0166134 | A1 | 7/2008 | McCallion et al. |
| 2009/0324173 | A1 | 12/2009 | Asghari |
| 2010/0189143 | A1 * | 7/2010 | Fukuda ................ H01S 5/026 372/20 |
| 2010/0246612 | A1 | 9/2010 | Shimizu |
| 2011/0149381 | A1 | 6/2011 | Hatakeyama |
| 2011/0206313 | A1 | 8/2011 | Dong et al. |
| 2011/0235659 | A1 * | 9/2011 | Fukuda ................ B82Y 20/00 372/20 |
| 2012/0057610 | A1 * | 3/2012 | Dallesasse ............ H01S 5/021 372/20 |
| 2012/0062900 | A1 | 3/2012 | Langley et al. |
| 2013/0016423 | A1 | 1/2013 | Zheng et al. |
| 2013/0051798 | A1 | 2/2013 | Chen et al. |
| 2013/0235890 | A1 * | 9/2013 | Creazzo ............ H01S 3/10053 372/20 |
| 2015/0207296 | A1 | 7/2015 | Rickman et al. |

FOREIGN PATENT DOCUMENTS

| | | |
|---|---|---|
| EP | 1 761 103 A1 | 3/2007 |
| EP | 2 544 319 A1 | 1/2013 |
| JP | 2013-93627 A | 5/2013 |
| WO | 00/36715 A1 | 6/2000 |
| WO | 02/41663 A2 | 5/2002 |
| WO | 02/079863 A2 | 10/2002 |
| WO | 2010/100489 A1 | 9/2010 |
| WO | 2014/060648 A1 | 4/2014 |

OTHER PUBLICATIONS

International Search Report and Written Opinion of the International Searching Authority, Mailed Sep. 16, 2015 and Received Sep. 17, 2015, Corresponding to PCT/GB2015/050524, 18 Pages.
U.K. Intellectual Property Office Search Report Dated Jul. 31, 2014, Received Aug. 1, 2014 for Patent Application No. GB1400909.6, 5 Pages.
U.K. Intellectual Property Office Search Report, Claims 27-52, Dated Oct. 20, 2014, Received Oct. 22, 2014 for Patent Application No. GB1400909.6, 3 Pages.
U.K. Intellectual Property Office Search Report, Claims 53-69, Dated Oct. 20, 2014, Received Oct. 22, 2014 for Patent Application No. GB1400909.6; 2 Pages.
U.K. Intellectual Property Office Search Report, Claims 70-72, Dated Oct. 20, 2014, Received Oct. 22, 2014 for Patent Application No. GB1400909.6, 3 Pages.
U.K. Intellectual Property Office Search Report, Dated Nov. 5, 2015, Received Nov. 6, 2015 for Patent Application No. GB1400909.6, 5 Pages.
Bernasconi, P. et al., Optical Switch Fabrics for Ultra-High-Capacity IP Routers, Journal of Lightwave Technology, Nov. 2003, pp. 2839-2850, vol. 21, No. 11, IEEE.
Cherchi, M. et al., Deeply etched MMI-based components on 4 μm thick SOI for SOA-based optical RAM cell circuits, Proceedings of SPIE, Jan. 1, 2013, 7 Pages, vol. 8629, No. 86290C-1, International Society for Optical Engineering, United States.
Farrington, N. et al., A Demonstration of Ultra-Low-Latency Data Center Optical Circuit Switching, ACM SIGCOMM Computer Communication Review '12, Aug. 13-17, 2012, pp. 95-96, vol. 42, No. 4.
Fischer, A.P.A. et al., Experimental and Theoretical Study of Filtered Optical Feedback in a Semiconductor Laser, IEEE Journal of Quantum Electronics, Mar. 2000, pp. 375-384, vol. 36, No. 3, IEEE.
Fujioka, N. et al., Compact and Low Power Consumption Hybrid Integrated Wavelength Tunable Laser Module Using Silicon Waveguide Resonators, Journal of Lightwave Technology, Nov. 1, 2010, pp. 3115-3120, vol. 28, No. 21.
Huang, Z. et al., Four-Wavelength III-V/SOI Heterogeneous Integrated Laser Based on Sampled Bragg Grating for CWDM, IEEE Photonics Journal, Oct. 2013, 7 Pages, vol. 5, No. 5, IEEE Photonics Society Publication.
Jalali, B. et al., Silicon Photonics, Journal of Lightwave Technology, Dec. 2006, pp. 4600-4615, vol. 24, No. 12.
Kachris, C. et al., A Survey on Optical Interconnects for Data Centers, IEEE Communications Surveys & Tutorials, Fourth Quarter 2012, pp. 1021-1036, vol. 14, No. 4.
Ngo, H.Q. et al., Constructions and Analyses of Nonblocking WDM Switches Based on Arrayed Waveguide Grating and Limited Wavelength Conversion, IEEE/ACM Transactions on Networking, Feb. 2006, pp. 205-217, vol. 14, No. 1.
Proietti, R. et al., 40 Gb/s 8×8 Low-latency Optical Switch for Data Centers, OSA/OFC/NFOEC, 2011, 3 Pages.
Proietti, R. et al., TONAK: A Distributed Low-latency and Scalable Optical Switch Architecture, 39th European Conference and Exhibition on Optical Communication (ECOC), 2013, pp. 1005-1007.
Smith, B.T. et al., Fundamentals of Silicon Photonic Devices, 2006, 7 Pages.
Tanaka, S. et al., High-output-power, single-wavelength silicon hybrid laser using precise flip-chip bonding technology, Optics Express, Dec. 4, 2012, pp. 28057-28069, vol. 20, No. 27.
Tsao, S. et al., A Novel MMI-MI SOI Temperature Sensor, IEEE 13th Annual Meeting Lasers and Electro-Optics Society 2000 Annual Meeting, LEOS 2000, 2000, pp. 464-465, vol. 2.
Xi, K. et al., Petabit Optical Switch for Data Center Networks, Technical Report, Sep. 11, 2010, pp. 1-9, Polytechnic Electrical & Computer Engineering Department, Polytechnic Institute of NYU, Brooklyn, New York. Located at http://eeweb.poly.edu/chao/publications/petasw.pdf.
Xu, D.X. et al., SOI Photonic Wire Waveguide Ring Resonators Using MMI Couplers, 3rd IEEE International Conference on Group IV Photonics, 2006, pp. 28-30, IEEE.

(56) References Cited

OTHER PUBLICATIONS

Ye, T. et al., A Study of Modular AWGs for Large-Scale Optical Switching Systems, Journal of Lightwave Technology, Jul. 1, 2012, pp. 2125-2133, vol. 30, No. 13.

Ye, T. et al., AWG-Based Non-Blocking Clos Networks, IEEE/ACM Transactions on Networking, Apr. 2015, pp. 491-504, vol. 23, No. 2.

Zhao, J. et al., Novel Lasers Using Multimode Interference Reflector, 2011 ICO International Conference on Information Photonics (IP), May 18, 2011, pp. 1-2; IEEE.

Zhao, J. et al., On-chip Laser with Multimode Interference Reflectors Realized in a Generic Integration Platform, Compound Semiconductor Week (CSW/IPRM), 23rd International Conference on Indium Phosphide and Related Materials, May 22, 2011, pp. 1-4, IEEE.

Zilkie, A.J. et al., Power-efficient III-V/Silicon external cavity DBR lasers, Optics Express, Sep. 27, 2012, pp. 23456-23462, vol. 20, No. 21.

Website: TL5300 Series LambdaFLEX Micro-iTLA Tunable Laser, Oclaro, Inc., http://www.oclaro.com/product/tl5300-series/, printed Nov. 3, 2015, 3 Pages.

* cited by examiner

TUNABLE SOI LASER

FIELD OF THE INVENTION

The present invention relates to a wavelength tunable silicon-on-insulator (SOI) laser having a phase-tunable waveguide platform comprising a first resonator device and a second resonator device.

BACKGROUND OF THE INVENTION

Tunable semiconductor lasers are often used for applications in which an occasional but precise tuning of wavelength is required. They can provide excellent wavelength stability and are typically manufactured as monolithic photonic integrated circuits (PICs) in a gain medium such as a III-V semiconductor material. However, they are expensive to manufacture as a result of the need for multiple epitaxial re-growth steps. To date, demonstrations have been relatively slow to tune, making them inadequate for certain applications.

Particularly in applications where the precise wavelength of the laser is not so important, there is a need for tunable lasers with a wide tuning range (>30 nm) but with fast switching speeds (of less than 100 ns or even more preferably less than 10 ns). Furthermore, in applications involving high data speeds and high device packing density, power efficiency is critical for technology adoption.

Silicon-on-insulator (SOI) lasers have become increasingly popular since SOI provides a practical, power efficient and cost-effective platform for the construction and integration of optical devices. Of course, the major challenge for SOI photonic integrated platforms is the fact that silicon is not an optical gain medium and does not therefore form an ideal medium for photonic circuits incorporating lasers. A common technique is to introduce a piece of gain material such as III-V gain material (often referred to as a gain chip) to a SOI photonic integrated circuit. An example of such a laser can be found in U.S. Pat. No. 6,101,210. A tunable laser constructed on a SOI PIC is disclosed in U.S. Pat. No. 8,559,470.

One drawback of such a design is the high optical power loss, particularly due to coupling between the waveguides formed from the silicon substrate and any waveguides in optical devices placed in, grown onto, or otherwise incorporated into the platform. Thus, there is also therefore a particular need for an SOI laser with an improved power efficiency.

SUMMARY OF THE INVENTION

According to a first aspect of the present invention, there is provided a wavelength tunable silicon-on-insulator (SOI) laser comprising: a laser cavity including: a semiconductor gain medium having a front end and a back end; and a phase-tunable waveguide platform coupled to the front end of the semiconductor gain medium, the phase-tunable waveguide platform comprising: a first multi-mode interference (MMI) device and a second MMI device, each MMI device including a pair of reflective surfaces defining a resonator cavity therebetween such that the device is configured to act as a Fabry-Perot filter; wherein at least one of the MMI devices is a phase-tunable MMI device.

In this way, each MMI device takes the form an MMI resonator which gives rise to a comb transmittance spectrum via the Fabry-Perot effect. The phase tunable MMI resonator can be phase tuned to select the mode of the laser cavity via the Vernier effect.

Preferably, each of the MMI devices includes a multimode waveguide; a first reflective layer at a back end of the MMI device; and a second reflective layer at a front end of the MMI device. The MMI devices are preferably 2×2 MMI devices having two ports at a back end and two ports at a front end, where one port at a back end has been replaced by a first reflective surface and where one port at a front end has been replaced by a second reflective surface.

Throughout this document, where the terms "back end" and "front end" are used, they act as labels to define two opposite ends of the MMI device, separated by the longitudinal length of the multimode cavity of the MMI device.

Preferably, the first reflective surface is therefore a reflecting layer such as a metal layer located on a back end surface of the multimode waveguide, adjacent a first waveguide which couples light into the back end of the multimode waveguide (i.e. where a 2×2 MMI waveguide forms the basic structure of the MMI device, one of the two back end waveguides coupled to the multimode waveguide may be an input waveguide and the other is replaced by the first reflective surface).

The first reflective surface could also be reflecting layer which terminates a waveguide at the back end of the multimode waveguide (i.e. where a 2×2 MMI waveguide forms the basic structure of the MMI device, one of the two back end waveguides coupled to the multimode waveguide may be an input waveguide and the other may be terminated by the first reflective surface).

Optionally, the second reflective surface is a reflecting layer such as a metal layer located on a front end surface of the multimode waveguide, adjacent a second waveguide which couples light out of the front end of the multimode waveguide.

Optionally, the second reflective surface is a reflecting layer such as a metal layer which terminates a waveguide which couples light out the front end of the multimode waveguide.

The finesse and number of cavity round-trips in the MMI resonator is controlled by the MMI cross and bar coupling ratio. This coupling ratio is designed for a high imbalance to create a high finesse and a high tuning effect enhancement, for example, the bar coupling may be 15% and the cross coupling 85%.

Preferably, a mirror of the laser cavity is located at the back end of the semiconductor gain medium. In this way, there is only one gain medium-SOI waveguide interface (i.e. that located at the front end of the gain medium). As a result, the tunable laser of the present invention has an improved power efficiency because the optical losses associated with coupling between the semiconductor gain medium and the waveguide platform are significantly reduced. In addition, the manufacturing complexity is reduced as it is only necessary to align the front end of the gain medium during manufacturing, for example in a flip-chip process.

With a mirror located at a back facet of the gain medium only one end (the front mirror) of the laser cavity is within the SOI waveguide platform such that the gain medium functions as a Reflective Semiconductor Optical Amplifier (RSOA).

The laser cavity is made up of the semiconductor gain medium and the phase-tunable waveguide platform. Preferably, said mirror located at the back end of the semiconductor gain medium has a reflectivity of at least 85% and even more preferably, the mirror has a reflectivity of at least 90%.

Preferably, said mirror located at the back end of the semiconductor gain medium is a reflective back-facet of the semiconductor gain medium.

Preferably, the phase-tunable MMI device includes a phase tuning region which comprises an electro-optical medium.

Optionally, the phase-tunable MMI device includes a phase tuning region which comprises a p-i-n junction region.

Optionally, the electro-optical medium may include a p-i-n junction in a SiGe bulk material. The use of a SiGe bulk material is less expensive and less complicated to fabricate than more complicated structures such as quantum well structures. In this case the electro-optical effect is the Franz-Keldysh (FK) effect in which case the phase of the transmittance spectrum may be adjusted by application of a reverse bias across the p-i-n junction. The reverse bias induces an electric field in the SiGe bulk material and, according to the FK effect, the refractive index of the material and the MMI device is changed, thus adjusting the phase and position in frequency space of the transmittance spectrum of the device.

The application of a bias may introduce undesirable effects such as a change in the coupling ratio of the MMI device. Techniques known in the art should be applied to compensate for such undesirable effects.

This tuning mechanism does not introduce a tuning-dependent loss, can generate modulation speeds of <1 ns, and operating in reverse bias requires lower power consumption.

Alternatively, the SiGe material may be a quantum well material. In this way, the electro-optical effect will be the Quantum Confined Stark Effect (QCSE). Again, the phase of the transmittance spectrum may be adjusted by application of a reverse bias across the p-i-n junction and the material of the quantum well material may be SiGe. The use of a quantum well material can result in even faster modulation speeds, and lower power consumption.

SiGe can be incorporated into SOI waveguides using methods known to those skilled in the art, and embodiments of this invention can involve incorporating SiGe bulk or QW material in the region designated for the MMI device, the SiGe composition or QW layers being engineered to have the right band-edge absorption that gives the strongest index change with minimal absorption increase.

The p- and n-doped regions are preferably positioned to address the trade-off between modulation speed and loss. A smaller distance between p and n type regions is better for higher speeds as long as loss is kept low. Preferably, the p-type region is at least 0.1 µm but no more than 15 µm from the waveguide centre line (the centre of the intrinsic region) and preferably the n-type region is at least 0.1 µm but no more than 15 µm from waveguide centre line, even more preferably for 40 Gb/s operation the n-type and p-type regions are at least 0.1 µm and no more than 0.5 µm from the waveguide centre line.

Optionally, the phase-tunable MMI device may include a phase tuning region which comprises a p-n junction region (i.e. may be doped such that it includes a pn junction device). In this way, the p-n junction device provides an electrically tunable phase tuning region whereby the phase of the transmittance spectrum of an MMI device can be adjusted using the free-carrier plasma dispersion electro-optical effect via carrier depletion by application of a varying reverse bias. The p-n junction may optionally be a $p^+$-p-n-$n^+$, or $p^{++}$-$p^+$-p-n-$n^+$-$n^{++}$ structure.

Where the phase tuning region includes a p-n junction, the junction may be offset from the waveguide centre line. For example, it may be offset by up to 0.5 µm; even more preferably for 40 Gb/s or greater modulation speeds it may be offset by up to 0.2 µm.

Preferably, both the first MMI device and the second MMI device are tunable MMI devices.

The phase tuning region of the first MMI device may include any one of: a p-n junction; p-i-n junction or another electro-optical medium, the carrier density of which can be manipulated by application of a voltage bias. The phase tuning region of the second MMI device may also include any one of: a p-n junction, p-i-n junction, or a different electro-optical medium, the carrier density of which can be manipulated by application of a voltage bias. The p-n, p-i-n, or other electro-optical medium may be a forward bias or a reverse bias depending on the properties of the phase tuning region chosen. Adjusting the bias will in turn adjust the phase and position in frequency space of the transmittance spectrum of that region.

The phase tuning region of the first MMI device may be of the same type and/or structure as the phase tuning region of the second MMI device; alternatively the phase tuning region of the first MMI device may be of a different type and/or structure from the phase tuning region of the second MMI device.

Preferably, the wavelength tunable laser further comprises a phase tuning region which is separate from the first and second MMI devices (i.e. which does not form a part of the phase-tunable MMI device(s)). This phase tuning region preferably forms an additional phase tuning device suitable for fine tuning the lasing frequency. The phase tuning device may include: a p-n junction, p-i-n junction or another electro-optical medium. Where a phase-tunable waveguide platform is bifurcated, there may be an additional phase tuning device in each arm of the platform.

Each additional phase tuning region/device present may include any one of: a p-n junction; p-i-n junction or another electro-optical medium. Furthermore, each additional phase tuning region may be of the same type and/or structure as the phase tuning region of the first and/or second MMI device and/or any other additional phase tuning regions present. Alternatively the phase tuning region of an additional phase tuning region may be of a different type and/or structure from the phase tuning region of the first and second MMI devices and from any other additional phase tuning regions present.

Preferably, the phase-tunable waveguide platform includes bifurcated waveguides, each arm of the bifurcated waveguides comprising one MMI device.

Optionally, the bifurcated waveguide platform may be a Y-branch waveguide platform.

Optionally, the phase-tunable waveguide platform includes a 1×3 coupler arranged to split light from the semiconductor gain medium into three branches: the first branch corresponding to a first arm of the bifurcated waveguides, comprising the first MMI device; the second branch corresponding to the second arm of the bifurcated waveguides, comprising the second MMI device; and the third branch corresponding to an output branch which forms the output of the laser cavity. The coupling ratio of the first and second branches may be equal. The coupling ratio to the laser output waveguide determines the effective front mirror reflectivity.

The 1×3 coupler may for example take the form of: a star coupler; two cascaded directional couplers; two cascaded MZ couplers; an MMI coupler and may be tunable. The use of a 1×3 coupler in the waveguide platform is advantageous as the overall length of the cavity is reduced as compared to alternative arrangements having two separate 1×2 couplers.

Optionally, the phase-tunable waveguide platform includes a first 1×2 coupler and a second 1×2 coupler: the first 1×2 coupler being configured to split light between the input of the second 1×2 coupler and a third branch which acts as an output branch; and the second 1×2 coupler being configured to split light between a first branch and a second branch, the first branch corresponding to the first arm of the bifurcated waveguides comprising the first MMI device; and the second branch corresponding to the second arm of the bifurcated waveguides comprising the second MMI device. This arrangement is advantageous over a 1×3 coupler arrangement because fabrication is easier although this is at the expense of a lengthening of the laser cavity.

In the arrangement described in the paragraph above, the split ratio of the second 1×2 coupler is preferably configured such that the percentage of light coupled to the output branch by the second 1×2 coupler is no less than 10% and no more than 30%.

Optionally, the phase-tunable waveguide platform comprises at least one transition region at which a waveguide of a first height is coupled to a waveguide of a second height; the second height being less than the first height.

Optionally, at least one of the first and second MMI devices is located in a waveguide of a second height.

In this way, where an MMI device includes a phase tuning region, the speed of switching is greater because the waveguide dimensions at this region are smaller. The second height waveguides are "high-speed high-confinement" waveguides. However, by using larger waveguide dimensions in regions of the waveguide where phase tuning is not taking place, the higher losses associated with smaller waveguides can be reduced.

Optionally the phase-tunable waveguide platform comprises a transition region at which a waveguide of a first width is coupled to a waveguide of a second width; the second width being less than the first width.

Optionally, at least one of the first and second MMI devices is located in a waveguide of said second width.

The transition region is preferably a region in which both the height and width of the waveguide platform changes.

The silicon overlayer thickness of the wavelength portion having a first height may be as much as 18 times the silicon overlayer thickness of the wavelength portion having a second height. Preferable values for the reduced "high-speed high-confinement" waveguide portion of the waveguide platform include a silicon overlayer thickness (T) of the waveguide platform which is more than or equal to 0.2 μm and less than or equal to 3.5 μm (this contrasts with the "standard" values of more than or equal to 2.5 μm and less than or equal to 3.5 μm elsewhere in the waveguide platform). Even more preferably, the silicon overlayer thickness of the "high-speed high-confinement" waveguide portion of the waveguide platform is more than or equal to 0.2 μm and less than or equal to 3.2 μm.

The second width may be as much as 14 times that of the first width. Preferable values for the reduced "high-speed high-confinement" waveguide portion of the waveguide platform include a ridge width (w) which is more than or equal to 0.3 μm and less than or equal to 1 μm (this contrasts with the "standard" values of more than or equal to 1 μm and less than or equal to 4 μm elsewhere in the waveguide platform). Even more preferably, the ridge width of one or more waveguides of the "high-speed high-confinement" waveguide portion of the waveguide platform is more than or equal to 0.45 μm and less than or equal to 0.9 μm.

Preferable values for the reduced "high-speed high-confinement" waveguide portion of the waveguide platform include a slab height (h) which is more than or equal to 0 μm and less than or equal to 0.4 μm (this contrasts with the "standard" values of more than or equal to 0 μm and less than or equal to 1.8 μm elsewhere in the waveguide platform). Even more preferably, the slab height of one or more waveguides of the "high-speed high-confinement" waveguide portion of the waveguide platform is more than or equal to 0.05 μm and less than or equal to 0.35 μm.

The transition region may include a taper. Where the transition region is a transition between two waveguides of different heights, the taper may include a vertical taper. Where a transition region is a transition between two waveguides of different widths, the taper will be a horizontal taper. Where the transition region is a transition between two waveguides of different heights and widths, a taper will taper in both vertical and the horizontal dimensions.

As a vertical taper can be difficult to create on a waveguide platform, this taper may in fact take the form of a multilayer rib waveguide transition having three layers/portions with laterally tapered walls which has the effect of tapering to couple a waveguide of a larger height and width to a waveguide of a smaller height and width.

Optionally, the transition region may be a mode transformer.

A transition region is preferably located between the point at which the waveguide platform is coupled to the semiconductor gain medium and the point at which the two bifurcated arms are coupled (i.e before the 1×2 or 1×3 coupler). In this way, the height (and/or width) of the waveguide is optimised for low loss at a first (greater) height (and/or width) within the gain medium but the height (and/or width) is optimised for high speed at a second (smaller) height (and/or width) at each arm of the bifurcated waveguide platform where the MMI devices are located.

Optionally, an additional transition region is located at the output of the laser cavity such that the output branch is initially of a second (smaller) height (and/or width) but is coupled to an output waveguide of a first (larger) height and/or width.

In tunable lasers, the tuning speed is dictated by two parameters, the modulation frequency of the laser cavity and the modulation speed of the phase tuner that is performing the wavelength tuning function. The modulation speed can range from 10 ps to 100 ns as discussed above, depending on the physical tuning effect, and diode design, and waveguide dimension. If the phase tuner modulation is sufficiently fast, the laser cavity modulation frequency must also be maximized.

The modulation frequency is proportional to the inverse of the laser cavity lifetime so to maximize the modulation frequency the cavity photon lifetime must also be minimized.

In addition, for a tunable laser it is desirable to have the cavity mode spacing sufficiently wide to avoid a mode-hop when the local temperature of the laser changes dynamically by a few degrees Celsius during the tuning process. For these reasons it is desirable to have the mode spacing, or the free-spectral-range (FSR) of the laser cavity, to be more than or equal to 30 GHz, and even more preferably more than or equal to 40 GHz.

Preferably, the round trip path length of the laser cavity is therefore no more than 1.5 mm, even more preferably, no more than 1 mm. According to a second aspect of the present invention, there is provided a phase-tunable multimode interference (MMI) device, the MMI device comprising: a multimode waveguide; a first reflective surface at a back end of the MMI device; a second reflective surface at a front end of the MMI device; and a phase tuning region between the first and second reflective surfaces; wherein the reflective surfaces are arranged to create a resonator cavity within the multimode waveguide such that the MMI device acts as a Fabry-Perot filter.

In this way, the phase-tunable MMI device acts as a phase-tunable resonator/filter with a variable free spectral range. Such a device can be used with another MMI device, with an alternative resonator or with a distributed Bragg reflector (DBR) in a laser cavity to create a wavelength tunable laser cavity that can be tuned using the Vernier effect.

The resonator cavity may be partially within the multimode waveguide or may be wholly within the multimode waveguide.

The phase-tunable multimode interference device is preferably a phase-tunable multimode interference device suitable for a silicon-on insulator laser.

Preferably, the first reflective surface is a reflecting layer on a back end facet of the multimode waveguide, adjacent a waveguide coupled to the back end of the multimode waveguide. The MMI device therefore takes the form of a 2×2 multimode interference device with two back end ports and two front end ports, where one back end ports has been replaced by the first reflective surface. In an alternative embodiment, rather than replacing one of the back end ports, the first reflective surface may terminate a waveguide coupled to that port.

Optionally, the second reflective surface is a reflecting layer located on a front end facet of the multimode waveguide, adjacent a front end coupled waveguide which couples light out of the front end of the multimode waveguide. In this case, one of the two front end ports of the 2×2 multimode device has been replaced by the second reflective surface.

Optionally, the second reflective surface is a reflecting layer located within a front end coupled waveguide which couples light out of the front end of the multimode waveguide. In this case, one of the two front end ports of the 2×2 multimode device is coupled to a waveguide, the waveguide being terminated by the second reflective surface.

The two ports at which reflective surfaces are located preferably have a coupling ratio of greater than 50% between them.

The phase tuning region is preferably any one of (or combination of): a p-n junction device; a p-i-n junction device; a bulk electro-optical material; or a quantum well electro-optical material.

The phase tuning region may be located at the multimode waveguide. In this way, no extra length needs to be added to the resonator cavity in order to incorporate the phase tuning region.

Alternatively, where the second reflecting surface is located in a front end waveguide, the phase tuning region may be located at the front end waveguide between the second reflecting surface and the MMI front end facet so that the phase tuning region is formed as part of the front end waveguide rather than as part of the multimode waveguide. For large MMI phase tuning regions, the modulation speed will be slow due to the large junction length and width, and the power efficiency will be relatively low. This embodiment, with a phase tuning region in a front end waveguide is therefore optimised for speed and power consumption as the front end waveguide is smaller than the multimode waveguide.

Furthermore, the FSR of the MMI device may be tunable by a combination of phase tuning and temperature tuning.

According to a third aspect of the present invention, there is provided a wavelength tunable silicon-on-insulator (SOI) laser comprising: a laser cavity including: a semiconductor gain medium having a front end and a back end; and a phase-tunable waveguide platform coupled to the front end of the semiconductor gain medium, the phase-tunable waveguide platform comprising: a first ring resonator having a first free spectral range (FSR); a second ring resonator having a second FSR different from the first FSR, the second ring resonator being coupled to the first ring resonator; wherein, at least one of the ring resonators is a phase-tunable ring resonator and wherein the laser cavity further comprises a multimode interference (MMI) coupler to couple light into the first ring resonator.

In this way, the phase-tunable ring resonator can be phase tuned to select the mode of the laser cavity via the Vernier effect.

Ring-resonators directly coupled to waveguides are known to involve precise and costly manufacturing methods associated with the need to fabricate a bending waveguide to come in close proximity with a straight waveguide with tight tolerances. The use of an MMI coupler therefore advantageously enables lower manufacturing tolerances and lower-cost manufacturing.

The light coupled into the ring resonator by the MMI device may be coupled from the semiconductor gain medium to the MMI device by a waveguide.

Preferably, a mirror of the laser cavity is located at the back end of the semiconductor gain medium. In this way, the gain medium functions as a Reflective Semiconductor Optical Amplifier (RSOA).

Preferably, said mirror located at the back end of the semiconductor gain medium has a reflectivity of at least 85% and even more preferably, the mirror has a reflectivity of at least 90%.

Preferably, said mirror located at the back end of the semiconductor gain medium is a reflective back-facet of the semiconductor gain medium.

Preferably, the wavelength tunable laser further comprises a second MMI coupler to couple light into the second ring resonator.

Preferably, the wavelength tunable laser further comprises a third MMI coupler to couple light out of the second ring resonator, wherein the third MMI coupler also forms a mirror of the laser cavity. The third MMI may itself include the mirror if its front end facet (at which a front end waveguide would normally be coupled) is instead terminated by a high-reflecting layer such as a metal layer. Alternatively, a waveguide section coupled to the front end of the third MMI coupler may be terminated by a highly-reflecting layer such as a metal layer which forms the mirror of the laser cavity.

Optionally, the second MMI coupler directly couples the first ring resonator to the second ring resonator. In this way, the number of couplers required is minimized thereby minimizing the coupler-associated losses (relative to embodiments with four MMI couplers described below).

Optionally, the phase-tunable waveguide platform further comprises an additional 2×2 MMI coupler to couple light out of the first ring resonator. This additional 2×2 MMI coupler may be a fourth 2×2 MMI coupler which couples light out of the first ring resonator to a straight waveguide which is then coupled to the second ring resonator via the second 2×2 MMI coupler. In this way, there are two MMI couplers located between the first ring resonator and the second ring resonator.

According to a fourth aspect of the present invention, there is provided a wavelength tunable silicon-on-insulator (SOI) laser comprising: a laser cavity including: a semiconductor gain medium having a front end and a back end; and a phase-tunable waveguide platform coupled to the semiconductor gain medium, the phase-tunable waveguide platform comprising: a first ring resonator having a first free spectral range (FSR); a second ring resonator having a second FSR different from the first FSR, the second ring resonator being coupled to the first ring resonator; wherein, at least one of the ring resonators is a phase-tunable ring resonator and wherein a mirror of the laser cavity is located at the back end of the semiconductor gain medium.

The second ring resonator may be directly coupled to the first ring resonator.

The following optional features may be present in either of the third and fourth aspects of the present invention.

Optionally, each ring resonator comprises a first half-ring with a first radius of curvature coupled to a second half-ring with a second radius of curvature, the second radius of curvature being less than the first radius of curvature. In this way, the overall losses of the laser cavity are reduced because the larger radius of curvature of the first half-ring reduces losses in that half of the ring resonators.

However, on the other hand, it can be advantageous to use ring resonators with a first half-ring having a radius of curvature the same as that of the second half-ring (within manufacturing tolerances). This is because if each ring resonator comprises two half-rings of a smaller size, the overall path length of the laser cavity will be reduced which gives rise to a smaller total cavity FSR.

In addition, by using ring resonators with a first half-ring having a radius of curvature the same as that of the second half-ring it is possible to directly couple the first and second ring resonators as described above. In such an arrangement, the first half-ring and second half-ring are preferably coupled to one another via a multimode interference coupler.

Preferably, the phase-tunable ring resonator includes a phase tuning region which comprises an electro-optical medium.

Optionally, the phase tuning region may comprise a p-i-n junction region.

Optionally, the electro-optical medium is made of a p-i-n junction in a SiGe bulk material. The use of a SiGe bulk material is less expensive and less complicated to fabricate than more complicated structures such as quantum well structures. In this case the electro-optical effect is the Franz-Keldysh (FK) effect in which case the phase of the transmittance spectrum may be adjusted by application of a reverse bias across the p-i-n junction. The reverse bias induces an electric field in the SiGe bulk material and, according to the FK effect, changes the refractive index of the material and of the ring resonator, thus adjusting the phase and position in frequency space of the transmittance spectrum of the device.

This tuning mechanism does not introduce a tuning-dependent loss, can generate modulation speeds of <1 ns, and operating in reverse bias also requires lower power consumption.

Alternatively, the SiGe material may be a quantum well material. In this way, the electro-optical effect will be the Quantum Confined Stark Effect (QCSE). Again, the phase of the transmittance spectrum may be adjusted by application of a reverse bias across the p-i-n junction and the material of the quantum well material may be SiGe. The use of a quantum well material can result in even faster modulation speeds, and lower power consumption.

SiGe can be incorporated into SOI waveguides using methods known to those skilled in the art, and embodiments of this invention can involve incorporating SiGe bulk or QW material in the region designated for the ring resonator, the SiGe composition or QW layers being engineered to have the right band-edge absorption that gives the strongest index change with minimal absorption increase.

Optionally, the phase tuning region may comprise a p-n junction device (i.e. may be doped such that it includes a p-n junction device). In this way, the p-n junction device provides an electrically tunable phase tuning region whereby the phase of the transmittance spectrum of device ring resonator can be adjusted using the free-carrier plasma dispersion electro-optical effect via carrier depletion by application of a varying reverse bias. The p-n junction may optionally be a $p^+$-p-n-$n^+$, or $p^{++}$-$p^+$-p-n-$n^+$-$n^{++}$ structure.

Where the phase tuning region includes a p-n junction, the junction may be offset from the waveguide centre line. For example, it may be offset by up to 0.5 µm; even more preferably for 40 Gb/s or greater modulation speeds it may be offset by up to 0.2 µm.

Preferably, both the first ring resonator and the second ring resonator are tunable ring resonators. In this case, the phase tuning region of the first ring resonator may include any one of: a p-n junction; p-i-n junction or another electro-optical medium, the carrier density of which can be manipulated by application of a voltage bias. The phase tuning region of the second ring resonator may also include any one of: a p-n junction, p-i-n junction, or a different electro-optical medium, the carrier density of which can be manipulated by application of a voltage bias. The p-n, p-i-n, or other electro-optical medium may be a forward bias or a reverse bias depending on the properties of the phase tuning region chosen. Adjusting the bias will in turn adjust the phase and position in frequency space of the transmittance spectrum of that region.

The phase tuning regions may have a circular shape according to standard teaching in the art. Where MMI couplers are used to couple half-rings of ring resonator, the phase tuning regions will take a crescent shape. This structure is chosen in order that the phase tuning regions of the rings do not intersect with or interfere with the MMIs.

The phase tuning region of the first ring resonator may be of the same type and/or structure as the phase tuning region of the second ring resonator; alternatively the phase tuning region of the first ring resonator may be of a different type and/or structure from the phase tuning region of the second ring resonator.

Optionally, the waveguide platform may include bifurcated waveguides, each arm of the bifurcated waveguides comprising one ring resonator. This bifurcated waveguide platform may be a Y-branch waveguide platform. Each ring resonator (one in each branch) may be coupled to a waveguide which is terminated by a reflector.

Optionally, the first ring resonator and second ring resonator may be fabricated in a nested configuration.

The wavelength tunable laser may further comprise a phase tuning region which is separate from the first and second ring resonators (i.e. which does not form a part of the phase-tunable ring resonator(s)). This phase tuning region preferably forms an additional phase tuning device suitable for fine tuning the lasing frequency. The phase tuning device may include: a p-n junction, p-i-n junction or another electro-optical medium. Where a phase-tunable waveguide platform is bifurcated, there may be an additional phase tuning device in each arm of the platform.

The phase tuning region of each additional (separate) phase tuning region present may include any one of: a p-n junction; p-i-n junction or another electro-optical medium. The phase tuning region of each additional phase tuning region may be of the same type and/or structure as the phase tuning region of the first and/or second ring resonator and/or any other additional phase tuning regions present. Alternatively the phase tuning region of an additional phase tuning region may be of a different type and/or structure to the phase tuning region of the first and second ring resonators and any other additional phase tuning regions present.

Optionally, the phase-tunable waveguide platform comprises at least one transition region at which a waveguide of a first height is coupled to a waveguide of a second height; the second height being less than the first height.

Optionally at least one of the first and second ring resonators is located in a waveguide of a second height. Even more preferably, both ring resonators are located in a waveguide of a second height. In this way, where a ring resonator includes a phase tuning region, the speed of switching is greater because the waveguide dimensions at this region are smaller. However, by using larger waveguide dimensions in regions of the waveguide where phase tuning is not taking place, the higher losses associated with smaller waveguides can be reduced.

Optionally the phase-tunable waveguide platform comprises a transition region at which a waveguide of a first width is coupled to a waveguide of a second width; the second width being less than the first width.

Optionally, at least one of the first and second ring resonators is located in a waveguide of said second width. Even more preferably, both ring resonators are located in a waveguide of a second width.

The transition region is preferably a region in which both the height and width of the waveguide platform changes.

The silicon overlayer thickness of the wavelength portion having a first height may be as much as 18 times the silicon overlayer thickness of the wavelength portion having a second height. Preferable values for the reduced "high-speed high-confinement" waveguide portion of the waveguide platform include a silicon overlayer thickness (T) of the waveguide platform which is more than or equal to 0.2 µm and less than or equal to 3.5 µm (this contrasts with the "standard" values of more than or equal to 2.5 µm and less than or equal to 3.5 µm elsewhere in the waveguide platform). Even more preferably, the silicon overlayer thickness of the "high-speed high-confinement" waveguide portion of the waveguide platform is more than or equal to 0.2 µm and less than or equal to 3.2 µm.

The second width may be as much as 14 times that of the first width. Preferable values for the reduced "high-speed high-confinement" waveguide portion of the waveguide platform include a ridge width (w) which is more than or equal to 0.3 µm and less than or equal to 1 µm (this contrasts with the "standard" values of more than or equal to 1 µm and less than or equal to 4 µm elsewhere in the waveguide platform). Even more preferably, the ridge width of one or more waveguides of the "high-speed high-confinement" waveguide portion of the waveguide platform is more than or equal to 0.45 µm and less than or equal to 0.9 µm.

Preferable values for the reduced "high-speed high-confinement" waveguide portion of the waveguide platform include a slab height (h) which is more than or equal to 0 µm and less than or equal to 0.4 µm (this contrasts with the "standard" values of more than or equal to 0 µm and less than or equal to 1.8 µm elsewhere in the waveguide platform). Even more preferably, the slab height of one or more waveguides of the "high-speed high-confinement" waveguide portion of the waveguide platform is more than or equal to 0.05 µm and less than or equal to 0.35 µm.

Optionally, the transition region may include a taper. Where the transition region is a transition between two waveguides of different heights, the taper may include a vertical taper. Where a transition region is a transition between two waveguides of different widths, the taper will be a horizontal taper. Where the transition region is a transition between two waveguides of different heights and widths, a taper will taper in both vertical and the horizontal dimensions.

As a vertical taper can be difficult to create on a waveguide platform, this taper may in fact take the form of a multilayer rib waveguide transition having three layers/portions with laterally tapered walls which has the effect of tapering to couple a waveguide of a larger height and width to a waveguide of a smaller height and width.

Optionally, the transition region may be a mode transformer.

Where a waveguide platform is bifurcated, a transition is preferably located between the point at which the waveguide platform is coupled to the semiconductor gain medium and the point at which the two bifurcated arms are coupled. In this way, the height (and/or width) of the waveguide is optimised for low loss at a first (greater) height (and/or width) in the gain medium but the height (and/or width) is optimised for high speed at a second height (and/or width) at each arm of the bifurcated waveguide platform where the ring resonators are located.

Optionally, an additional transition region is located at the output of the laser cavity such that the output branch is initially of a second (smaller) height (and/or width) but is coupled to an output waveguide of a first (larger) height and/or width.

Preferably, the round trip path length of the laser cavity is no more than 1.5 mm, even more preferably, no more than 1 mm.

According to a fifth aspect of the present invention, there is provided a wavelength tunable silicon-on-insulator (SOI) laser comprising: a laser cavity including: a semiconductor gain medium having a front end and a back end; and a phase-tunable waveguide platform coupled to the front end of the semiconductor gain medium, the phase-tunable waveguide platform comprising: a first waveguide Fabry-Perot filter and a second waveguide Fabry-Perot filter, at least one of the Fabry-Perot filters being a phase-tunable Fabry-Perot filter; wherein a mirror of the laser cavity is located at the back end of the semiconductor gain medium. Preferably, the first and second Fabry-Perot filters are formed by a total of three cascaded Distributed Bragg Reflector (DBR) gratings.

In this way, the DBR grating arrangement has a smaller size so the cavity length is reduced. Such an arrangement is also advantageous as it leads to lower losses. Fewer components can also be advantageous for fabrication.

Preferably, the first and second Fabry-Perot filters are formed by a total of three waveguide partial reflectors.

Preferably, the phase-tunable waveguide platform includes bifurcated waveguides, one arm of the bifurcated waveguides comprising both the first and second Fabry-Perot filters in a series arrangement. In this way, the laser output may be located in the second bifurcated arm.

The bifurcated waveguide platform may be a Y-branch waveguide platform. In this way, the laser cavity is smaller in size; a reduced optical path length is advantageous, and lower losses are involved.

Preferably, the tunable waveguide platform includes a 1×2 coupler which couples light from the semiconductor gain medium into: a first branch containing the first and second Fabry-Perot filters; and a second branch containing the laser output.

Preferably, the phase-tunable Fabry-Perot filter includes a phase tuning region which comprises an electro-optical medium.

Optionally, the phase tuning region comprises a p-i-n junction region.

Optionally, the electro-optical medium is made of a p-i-n junction in a SiGe bulk material. The use of a SiGe bulk material is less expensive and less complicated to fabricate than more complicated structures such as quantum well structures. In this case the electro-optical effect is the Franz-Keldysh (FK) effect in which case the phase of the transmittance spectrum may be adjusted by application of a reverse bias across the p-i-n junction. The reverse bias induces an electric field in the SiGe bulk material and, according to the FK effect, changes the refractive index of the material and the optical path length of the FP filter, thus adjusting the phase and position in frequency space of the transmittance spectrum of the device.

This tuning mechanism does not introduce a tuning-dependent loss and, can generate modulation speeds of <1 ns, and operating in reverse bias also requires lower power consumption.

Alternatively, the SiGe material may be a quantum well material. In this way, the electro-optical effect will be the Quantum Confined Stark Effect (QCSE). Again, the phase of the transmittance spectrum may be adjusted by application of a reverse bias across the p-i-n junction and the material of the quantum well material may be SiGe. The use of a quantum well material can result in even faster modulation speeds, and lower power consumption.

SiGe can be incorporated into SOI waveguides using methods known to those skilled in the art, and embodiments of this invention can involve incorporating SiGe bulk or QW material in the region designated for the FP filter, the SiGe composition or QW layers being engineered to have the right band-edge absorption that gives the strongest index change with minimal absorption increase. The p- and n-doped regions are preferably positioned to address the trade-off between modulation speed and loss. A smaller distance between p and n type regions is better for higher speeds as long as loss is kept low. Preferably, the p-type region is at least 0.1 μm but no more than 15 μm from the waveguide centre line (the centre of the intrinsic region) and preferably the n-type region is at least 0.1 μm but no more than 15 μm from waveguide centre line, even more preferably for 40 Gb/s operation the n-type and p-type regions are at least 0.1 μm and no more than 0.5 μm from the waveguide centre line.

Optionally, the phase tuning region which comprises a p-n doped region (i.e it may be doped such that it includes a p-n junction device). In this way, the p-n junction device provides an electrically tunable phase tuning region whereby the phase of the transmittance spectrum of the FP filter can be adjusted using the free-carrier plasma dispersion electro-optical effect via carrier depletion by application of a varying reverse bias.

The p-n junction may optionally be a $p^+$-p-n-$n^+$, or $p^{++}$-$p^+$-p-n-$n^+$-$n^{++}$ structure. Where the phase tuning region includes a p-n junction, the junction may be offset from a centre line. For example, it may be offset by up to 0.5 μm; even more preferably for 40 Gb/s or greater modulation speeds it may be offset by up to 0.2 μm.

Preferably, both the first Fabry-Perot filter and the second Fabry-Perot filter are tunable Fabry-Perot filters. In this case, the phase tuning region of the first Fabry-Perot filter is optionally any one of or combination of: a p-n junction; p-i-n junction or another electro-optical medium; and the phase tuning region of the second Fabry-Perot filter is optionally any one of or combination of: a p-n junction, p-i-n junction or another electro-optical medium. The phase tuning region of the first Fabry-Perot filter may be of the same type and/or structure as the phase tuning region of the second Fabry-Perot filter; alternatively the phase tuning region of the first Fabry-Perot filter device may be of a different type and/or structure from the phase tuning region of the second Fabry-Perot filter.

Optionally, the phase-tunable waveguide platform comprises at least one transition region at which a waveguide of a first height is coupled to a waveguide of a second height; the second height being less than the first height.

Optionally, the first and second Fabry-Perot filters are located in a waveguide of a second height. In this way, where a Fabry-Perot filter includes a phase tuning region, the speed of switching is greater because the waveguide dimensions at this region are smaller. However, by using larger waveguide dimensions in regions of the waveguide where phase tuning is not taking place, the higher losses associated with smaller waveguides can be reduced.

Optionally, the phase-tunable waveguide platform comprises a transition region at which a waveguide of a first width is coupled to a waveguide of a second width; the second width being less than the first width. Preferably, the first and second Fabry-Perot filters are located in a waveguide of said second width.

The transition region is preferably a region in which both the height and width of the waveguide platform changes.

The silicon overlayer thickness of the wavelength portion having a first height may be as much as 18 times the silicon overlayer thickness of the wavelength portion having a second height. Preferable values for the reduced "high-speed high-confinement" waveguide portion of the waveguide platform include a silicon overlayer thickness (T) of the waveguide platform which is more than or equal to 0.2 μm and less than or equal to 3.5 μm (this contrasts with the "standard" values of more than or equal to 2.5 μm and less than or equal to 3.5 μm elsewhere in the waveguide platform). Even more preferably, the silicon overlayer thickness of the "high-speed high-confinement" waveguide portion of the waveguide platform is more than or equal to 0.2 μm and less than or equal to 3.2 μm.

The second width may be as much as 14 times that of the first width. Preferable values for the reduced "high-speed high-confinement" waveguide portion of the waveguide platform include a ridge width (w) which is more than or equal to 0.3 μm and less than or equal to 1 μm (this contrasts with the "standard" values of more than or equal to 1 μm and less than or equal to 4 μm elsewhere in the waveguide platform). Even more preferably, the ridge width of one or more waveguides of the "high-speed high-confinement" waveguide portion of the waveguide platform is more than or equal to 0.45 μm and less than or equal to 0.9 μm.

Preferable values for the reduced "high-speed high-confinement" waveguide portion of the waveguide platform include a slab height (h) which is more than or equal to 0 μm and less than or equal to 0.4 μm (this contrasts with the "standard" values of more than or equal to 0 μm and less than or equal to 1.8 μm elsewhere in the waveguide platform). Even more preferably, the slab height of one or more waveguides of the "high-speed high confinement" waveguide portion of the waveguide platform is more than or equal to 0.05 μm and less than or equal to 0.35 μm.

Optionally, the transition region includes a taper. Where the transition region is a transition between two waveguides of different heights, the taper will be a vertical taper. Where a transition region is a transition between two waveguides of different widths, the taper will be a horizontal taper. Where the transition region is a transition between two waveguides of different heights and widths, a taper will taper in both vertical and the horizontal dimensions.

Optionally, the transition region is a mode transformer.

Where the first and second Fabry-Perot filters are arranged in series, a transition region is preferably located between the point at which the waveguide platform is coupled to the semiconductor gain medium and the point at which the closest Fabry-Perot filter is located. In this way, the height (and/or width) of the waveguide is optimised for low loss at a first (greater) height (and/or width) in the gain medium but the height (and/or width) is optimised for high speed at a second (smaller) height (and/or width) at the portion of the waveguide platform where the Fabry-Perot Filters are located.

Where a waveguide platform is bifurcated, a transition is optionally located between the point at which the waveguide platform is coupled to the semiconductor gain medium and the point at which the two bifurcated arms are coupled. In this way, the height (and/or width) of the waveguide is maximised at a first height (and/or width) in the gain medium but the height (and/or width) is minimised at a second height (and/or width) at the arm of the bifurcated waveguide platform where the Fabry-Perot filters are located. In alternative embodiments, a transition region may be located after the bifurcation.

Optionally, an additional transition region is located at the output of the laser cavity such that the output branch is initially of a second (smaller) height (and/or width) but is coupled to an output waveguide of a first (larger) height and/or width.

Preferably, the round trip path length of the laser cavity is no more than 1.5 mm, even more preferably, no more than 1 mm.

According to a sixth aspect of the present invention, there is provided a wavelength tunable silicon-on-insulator (SOI) laser comprising: a laser cavity including: a semiconductor gain medium having a front end and a back end, wherein a mirror of the laser cavity is located at the back end of the semiconductor gain medium; and a phase-tunable waveguide platform coupled to the front end of the semiconductor gain medium, the phase-tunable waveguide platform comprising: a first resonator and a second resonator; at least one resonator being a phase-tunable resonator; wherein the first resonator is any one of: an MMI device including a pair of reflective surfaces defining a resonator cavity therebetween such that the device is configured to act as a Fabry-Perot filter; a ring resonator; or a waveguide Fabry-Perot filter; and wherein the second resonator is any one of: an MMI device including a pair of reflective surfaces defining a resonator cavity therebetween such that the device is configured to act as a Fabry-Perot filter; a ring resonator; or a waveguide Fabry-Perot filter.

According to a seventh aspect of the present invention, there is provided a wavelength tunable silicon-on-insulator (SOI) laser comprising: a laser cavity including: a semiconductor gain medium having a front end and a back end, wherein a mirror of the laser cavity is located at the back end of the semiconductor gain medium; and a phase-tunable waveguide platform coupled to the front end of the semiconductor gain medium, the phase-tunable waveguide platform comprising: a first resonator; and a distributed Bragg reflector (DBR); at least one of the resonator and the DBR being phase-tunable; wherein the first resonator is any one of: an MMI device including a pair of reflective surfaces defining a resonator cavity therebetween such that the device is configured to act as a Fabry-Perot filter; a ring resonator; or a waveguide Fabry-Perot filter; and wherein the DBR is any one of: a DBR having a comb reflectance spectrum; and a digital supermode DBR (DS-DBR). Optional features of the invention will now be set out. These are applicable singly or in any combination with any aspect of the invention.

Throughout this document, references to "light" should be understood to include electromagnetic radiation of infrared and ultraviolet wavelengths as well as the visible spectrum. The range in output wavelengths of the laser will depend on the semiconductor gain medium used which may have a range of 0.4-20 μm. Taking into account the SOI platform, a tunable SOI laser typically has a wavelength range of 1.1 to 1.7 μm.

Further optional features of the invention are set out below.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES OF THE INVENTION

Embodiments of the present invention which relate to SOI lasers including multimode interference devices are described below with reference to FIGS. 1 to 5.

Figure 1:
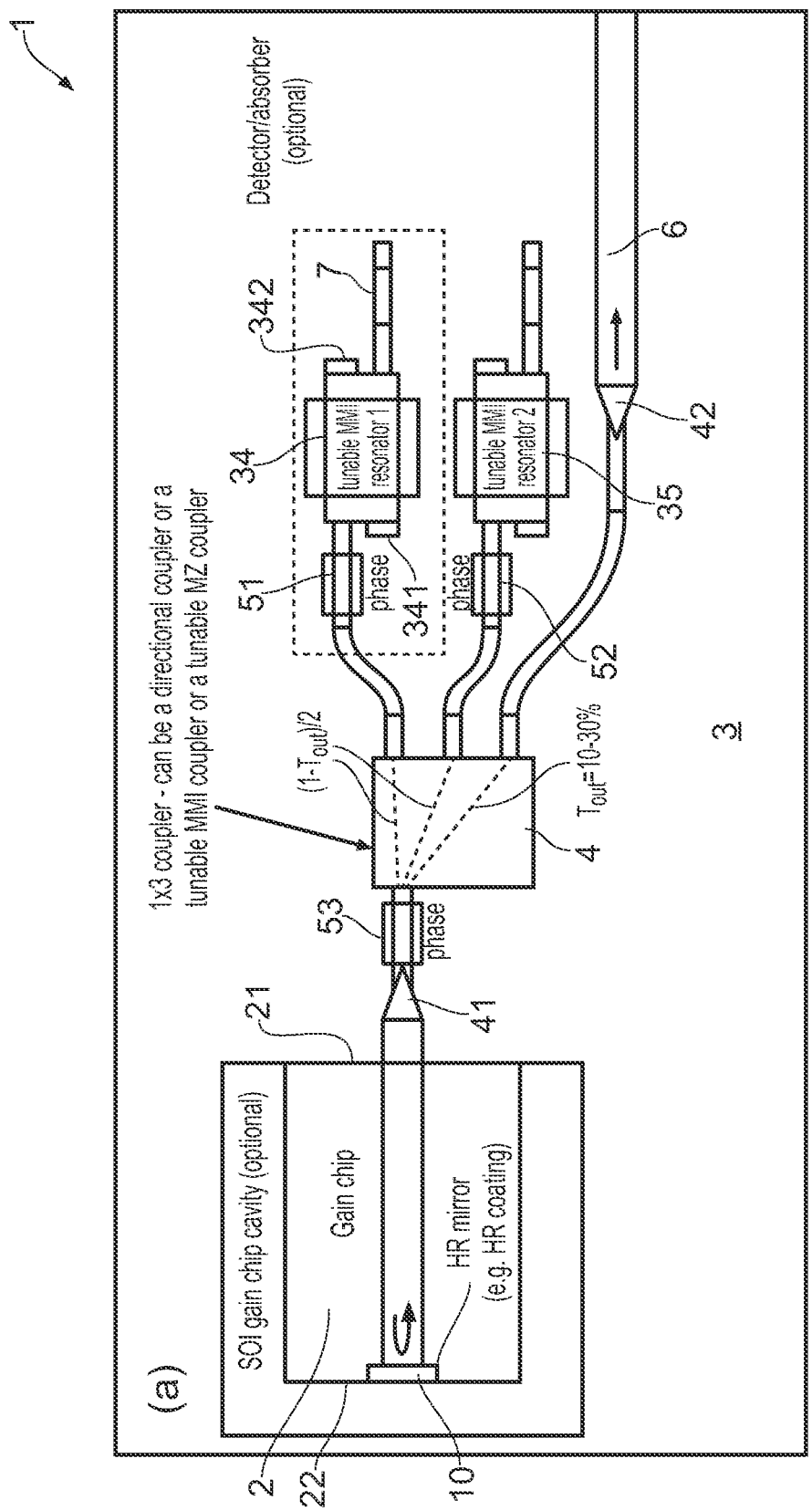
FIG. 1 shows a top-view schematic of a wavelength tunable laser according to the first and sixth aspects of the present invention.

Referring to FIG. 1, a wavelength tunable silicon-on-insulator (SOI) laser is shown, the laser having a laser cavity which is made up of a semiconductor gain medium, 2 and a phase-tunable waveguide platform, 3 coupled to the front end of the semiconductor gain medium. In the embodiment shown in FIG. 1, the semiconductor gain medium, 2 takes the form of a gain chip and the gain chip shown is located inside of an SOI gain chip cavity.

Figure 3:
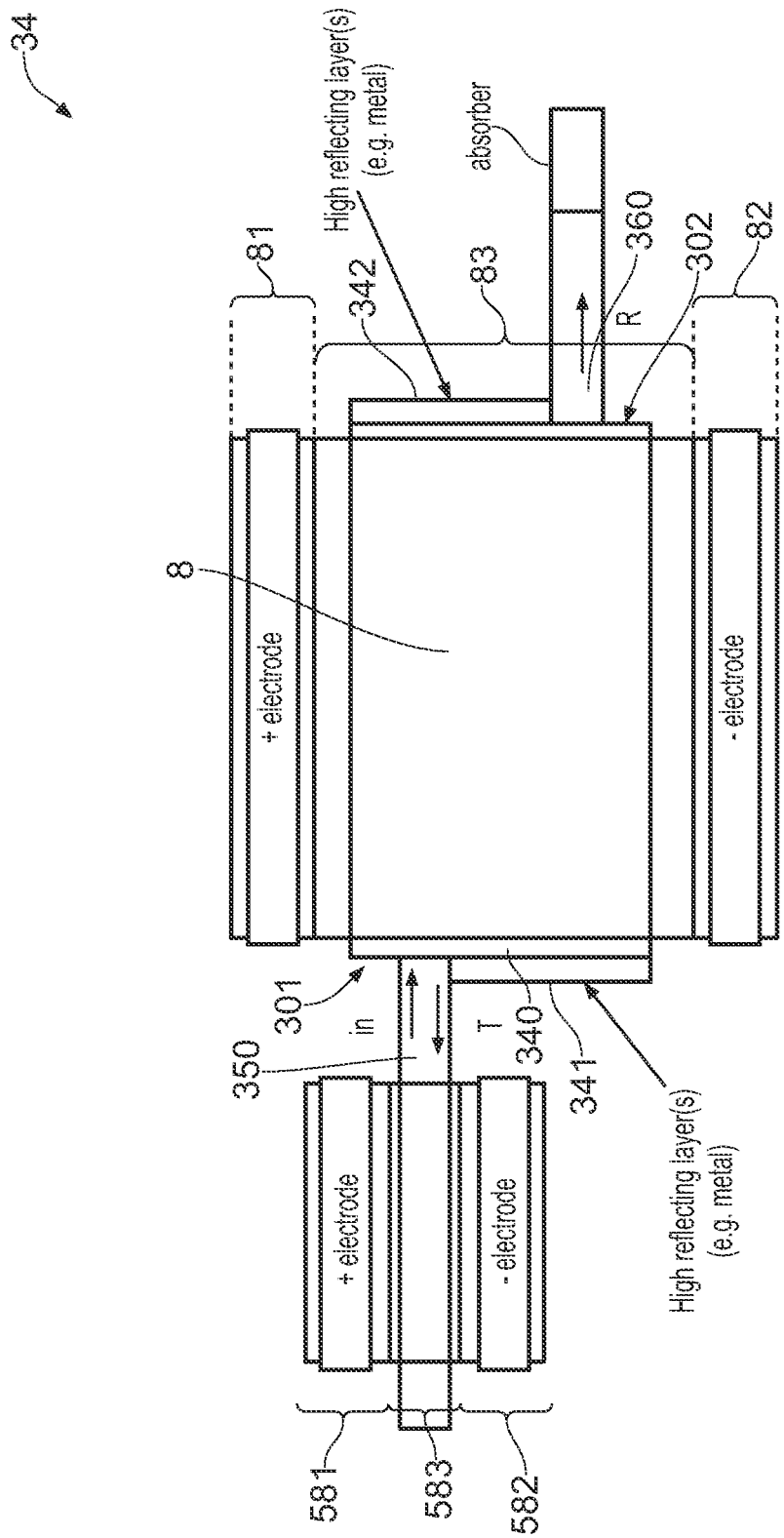
FIG. 3 shows a top view schematic of a phase tunable MMI device and an additional phase section for fine tuning of the laser cavity (corresponding to the area shown in the dotted box in FIGS. 1 and 2), for use in the wavelength tunable lasers shown in FIGS. 1 and 2 and according to the second and sixth aspects of the present invention.

The phase-tunable waveguide platform includes a first multimode interference (MMI) device (MMI resonator device) 34 (as shown in FIG. 3), and a second MMI device (MMI resonator device), 35 in a parallel arrangement. Each MMI device includes a multi-mode waveguide; a first reflective surface, 341 partially covering one end of the multimode waveguide; and a second reflective surface, 342 partially covering an opposite end of the multimode waveguide such that the arrangement of the mirrors either side of the multimode waveguide of the MMI device forms a resonator and therefore the device acts as a Fabry-Perot filter. Each MMI device takes the form of a 2×2 MMI having a multimode waveguide with two ports at its back end 301 and two ports at its front end 302, whereby the first reflective surface 341 either replaces a port at the front end or is located in a waveguide coupled to that port and whereby the second reflective surface either replaces a port at the back end or is located in a waveguide coupled to that port.

Each of the first and second MMI devices will produce a comb-like transmittance spectrum, 91, 92, and the dimensions of the MMI devices are chosen such that the free spectral range (FSR) of the first MMI device is different from the FSR ($FSR_2$) of the second MMI device.

At least one of the MMI devices, 34, 35 includes a phase tuning region and therefore forms a phase-tunable MMI device. Thus, the cavity mode of the laser (and therefore its wavelength) can be selected via the Vernier effect. Where both MMI devices are phase-tunable, as shown in FIG. 1, the laser output wavelength will be continuously tunable. However, if only one MMI device is tunable, the output laser will be adjustable in that any of the discrete wavelengths present in the transmittance comb spectrum of the other MMI device can be chosen.

A Fabry-Perot filter is a type of Infinite-Impulse-Response (IIR) filter and as with all Infinite-Impulse-Response (IIR) filters, the effect of index change induced by a phase tunable region will be enhanced by a large number of round-trips in the resonator cavity. This means that a smaller injected current density (or smaller applied voltage) is required to achieve a desired wavelength change of at least 6 nm.

In the embodiment shown in FIG. 1, the phase-tunable waveguide platform is made up of three branches, each of the branches being coupled to the semiconductor gain medium, 2 via a 1×3 coupler, 4.

The first phase-tunable MMI device, 34 is located in the first branch of the waveguide platform; the second phase-tunable MMI device, 35 is located in the second branch of the waveguide platform; and the third branch of the waveguide platform forms the output of the laser cavity, 6.

A detector or an absorber, 7 may optionally be located at the end of the first or the second branch (i.e. at the opposite side of the MMI device to the 1×3 coupler).

In the embodiment shown in FIG. 1, each of the first and second branches includes an additional phase tuning region, 51, 52 which is separate from the first and second MMI devices, 34, 35 and forms a means for fine tuning of the frequency of the laser. In alternative embodiments (not shown) the laser cavity may include fewer than three additional phase tuning regions. If one additional phase tuner which may be located in any of the three locations labelled 51, 52, 53. If just two additional phase tuning regions are present, they may be located at any two of the three locations labelled 51, 52, 53.

A third additional and separate phase tuning region, 53 is located between the semiconductor gain medium, 2 and the 1×3 coupler, 4.

Also located between the semiconductor gain medium, 2 and the 1×3 coupler, 4 is a transition region, 41 in the form of a taper. At the transition region 41, the height and width of the waveguide platform changes from a first height and width to a second height and width, the first height and the first width being greater than the second height and the second width respectively. In the embodiment shown, all phase-tunable regions are located at parts of the waveguide platform at which the waveguide has a reduced width and height.

A second transition region, 42 is located at the output of the laser such that the output changes from a waveguide at a second (smaller) height and width to a first (larger) height and width. The larger height and width output of the laser is therefore of a size which is more advantageous when coupling to application components such as a gain chip and a single-mode fibre.

An example of the type of taper which forms both the first and second transition regions 41, 42 is discussed in more detail below in relation to FIG. 13.

The semiconductor gain medium has a front end, 21 and a back end, 22; and a mirror of the laser cavity is located at the back end. In the embodiment shown in FIG. 1, the semiconductor gain medium takes the form of a gain chip, and the mirror 10 at the back end of the cavity takes the form of a reflective surface (e.g. metal or dielectric coating) directly applied to the back end of the gain medium, in this case a reflective back facet of the gain chip. In the embodiment shown in FIG. 1 (a) the waveguide platform includes an SOI gain chip cavity for location of the gain chip.

The reflective surface which forms the back mirror of the laser cavity is highly reflective, having a reflectivity of at least 85% (preferably at least 95%).

The 1×3 coupler is shown as a tunable MMI coupler (or a directional coupler or tunable Mach Zehnder coupler). The split ratio of the coupler is such that between 10 and 30% of the transmittance output is coupled to the third (laser output) branch, $T_{out}$=10-30%. The remaining transmittance is split evenly between the first and the second branch such that the transmittance of each of the first and second branches is given by $(1-T_{out})/2$.

Each MMI device is a phase-tunable MMI device so includes a phase tuning region 8. This is described in more detail below in relation to FIGS. 3 and 4.

Figure 2:
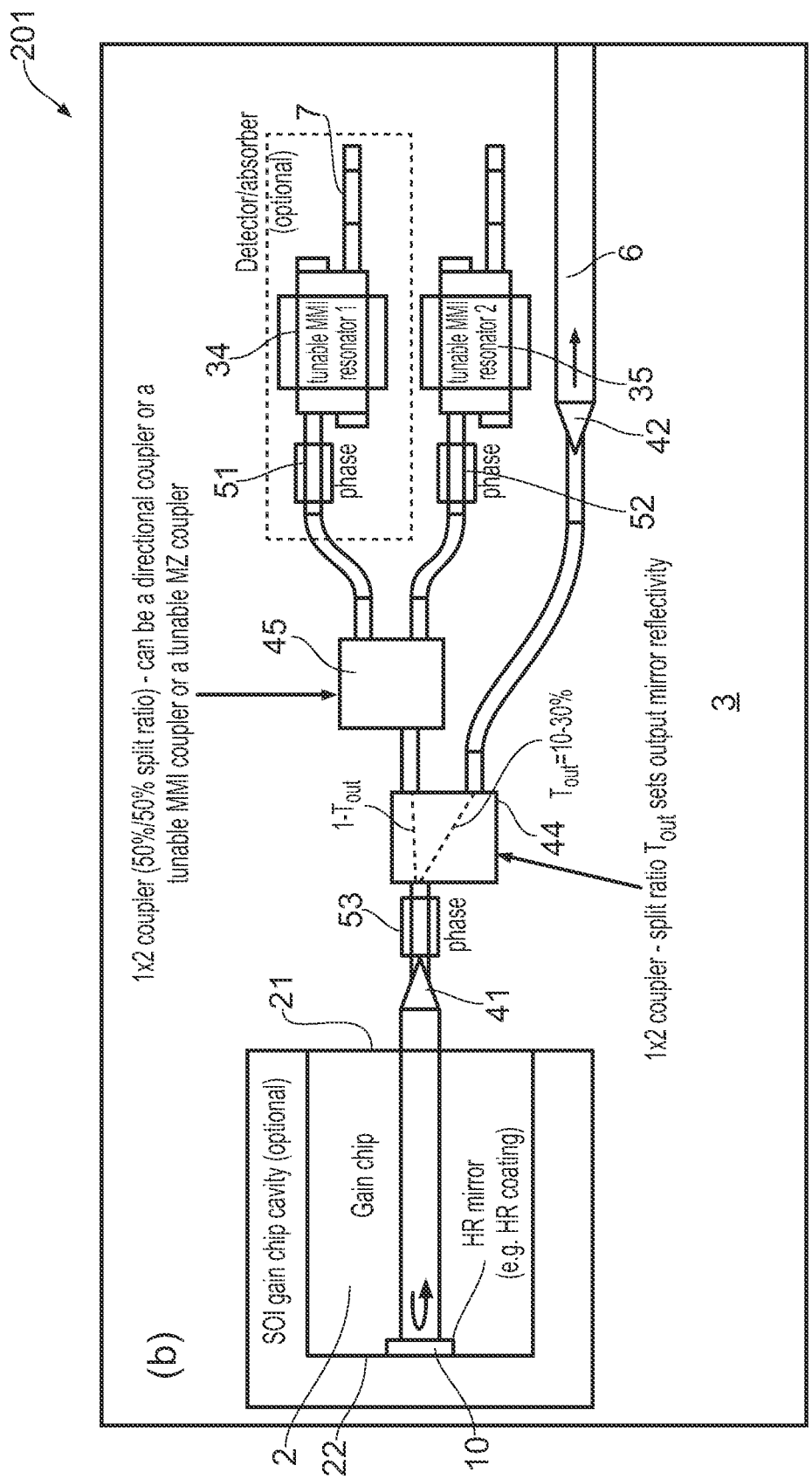
FIG. 2 shows a top-view schematic of an alternative wavelength tunable laser according to the first and sixth aspects of the present invention.

A second embodiment of the first aspect is shown in FIG. 2, where like references indicate the features described above in relation to FIG. 1.

The wavelength tunable laser 601 shown in FIG. 2 differs from that shown in FIG. 1 in that, rather than including a single 1×3 coupler, it includes a first 1×2 coupler, 44 and a second 1×2 coupler, 45.

The first 1×2 coupler splits light between the input to the second 1×2 coupler and the output branch of the laser. This first 1×2 coupler has a split ratio which transmits from 10% to 30% of the total light it transmits to the output branch of the laser cavity. The remaining 90-70% is sent to the second 1×2 coupler which then splits the light at it's input between the first and second branches in a 50:50 ratio.

A transition region 41 is located between the semiconductor gain medium, 2 and the first 1×2 coupler 44.

Figure 4:
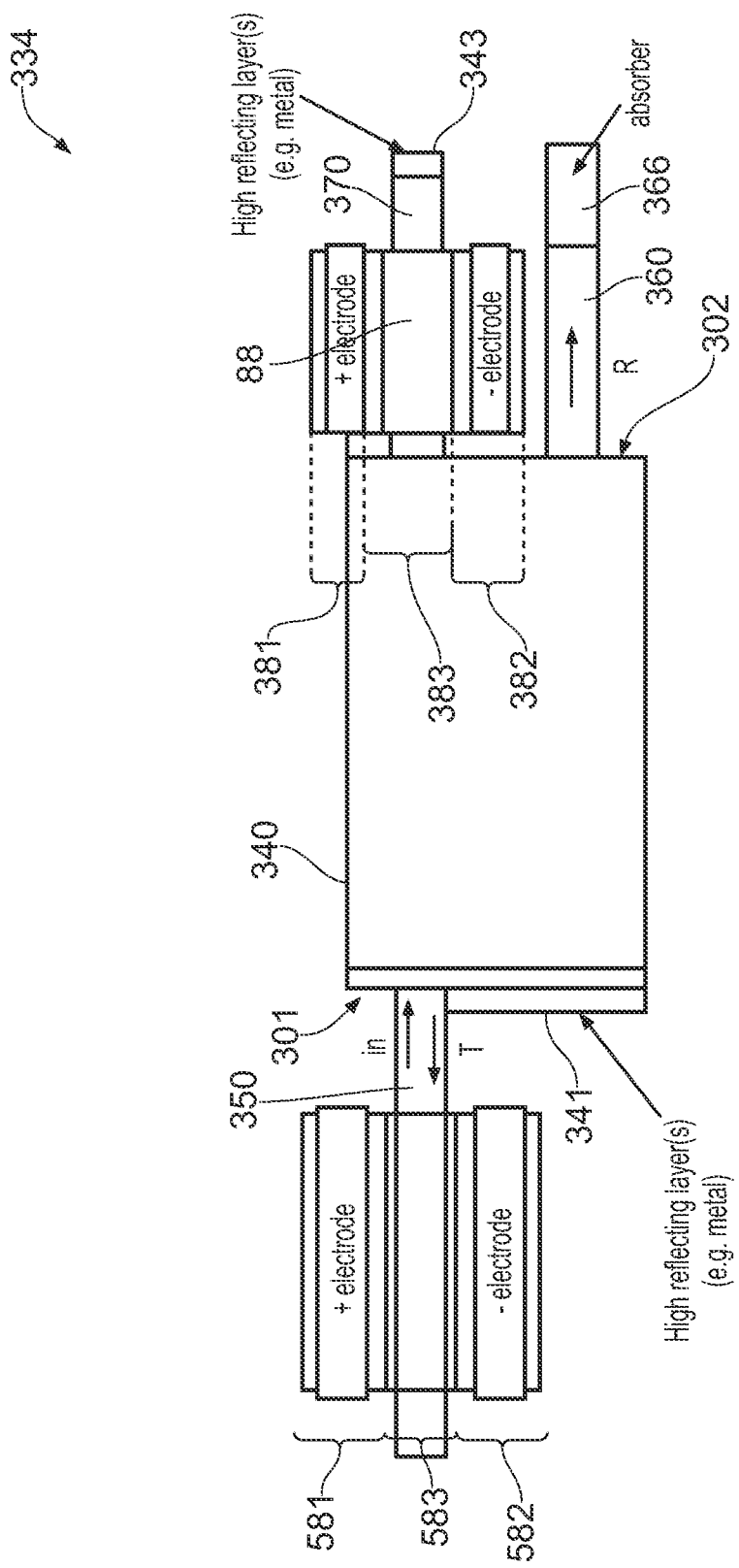
FIG. 4 shows a top view schematic of an alternative MMI device for use in the wavelength tunable lasers shown in FIGS. 1 and 2 and according to the second and sixth aspects of the present invention.

FIGS. 3 and 4 show embodiments of a phase-tunable MMI resonator device and additional separate phase tuning regions. FIG. 3 shows the phase-tunable MMI device and additional (separate) phase tuning regions, also indicated within dotted lines in FIGS. 1 and 2, whereas FIG. 4 shows an alternative MMI device that could also be used in the waveguide platform shown in FIG. 1.

Each of the MMI devices shown in FIGS. 3 and 4 includes: a multimode waveguide, 340; a first reflective surface, 341 at a back end, 301 of the MMI device; a second reflective surface, 342, 343 at a front end, 302 of the MMI device; and a phase tuning region between the first and second reflective surfaces. A first waveguide, 350 (or "back end" waveguide) is coupled to the back end of the multimode waveguide and a second waveguide, 360 ("front end" waveguide) is coupled to the front end of the multimode waveguide. The first reflective surface, 341 is located at a back end facet, 301 of the multimode waveguide, adjacent the "back end" coupled waveguide, 350. It is located such that, were the MMI device to be a 2×2 MMI device, the first reflective surface 341 would replace one of the two back end ports (the other back end port being coupled to the back end waveguide 350).

In both embodiments, the phase tuning region of the MMI device 34, 334 takes the form of a waveguide portion made of a material capable of forming an electrical optical medium (such as Si, Ge or SiGe) which has been doped to form a p-i-n junction containing: a p-doped region, 81, an n-doped region, 82 region and an intrinsic region, 83 therebetween. The p-doped and n-doped regions, 81, 82 are detached from the waveguide defining an intrinsic region therebetween which overlaps the whole width of the waveguide at which it is located.

Also in both embodiments, the additional phase tuning regions 51, 52, 53 comprise a phase tuning region the form of a waveguide portion made of a material capable of forming an electrical optical medium (such as Si, Ge, or SiGe) which has been doped to form a p-i-n junction containing: a p-doped region, 581, an n-doped region, 582 region and an intrinsic region, 583 therebetween. The p-doped and n-doped regions 581, 582 are detached from the waveguide defining an intrinsic region therebetween which overlaps the whole width of the waveguide at which it is located.

In the embodiment of the MMI device 34 shown in FIG. 3, the second reflective surface, 342, takes the form of a reflecting layer located on a front end facet of the multimode waveguide, adjacent the front end coupled waveguide. The second reflective surface is located such that, were the MMI device to be a 2×2 MMI device, the second reflective surface would replace one of the two front end ports (the other front end port being coupled to the front end waveguide 360).

In this embodiment, the resonator cavity is wholly within the multimode waveguide and the phase tuning region of the MMI device, 8 is located at the multimode waveguide and the pin doped region, particularly the intrinsic region, overlaps the width of the multimode waveguide.

The MMI devices 34, 334 may include a p-n junction (e.g. a p+pnn+diode) rather than a p-i-n junction. Either way, when in operation, the tuning of the MMI device of FIG. 3 occurs over the whole multimode waveguide region. Injecting carriers or applying a reverse bias voltage acts to tune the refractive index of the phase-tunable region of the MMI device which adjusts its free spectral range.

In the embodiment of an MMI device 334 shown in FIG. 4, the second reflective surface 343, takes the form of a reflective layer located within the front end coupled waveguide which couples light out of the front end of the multimode waveguide. In this embodiment, the resonator cavity formed by the first and second reflective surfaces is partially within the multimode waveguide. The phase tuning region of the MMI device 88 is located at the front end waveguide so that the p-i-n doped region 381, 382, 383, (particularly the intrinsic region, 383) of the p-i-n junction, overlaps the width of the front end waveguide.

Although the MMI resonator devices shown in FIGS. 3 and 4 show a p-i-n doped junction; this may, instead be a p-n junction. In addition, although the p-i-n junction of the MMI device shown in FIGS. 3 and 4 has an intrinsic region which overlaps the entire width of the relevant waveguide, the intrinsic region may be narrower than the relevant waveguide (not shown). Both embodiments shown in FIGS. 3 and 4 include a detector or absorber 366 located within an additional waveguide 360 coupled to the additional front end port (i.e. a port which does not form and is not coupled to the second reflective surface 343).

For the lasers described in relation to FIGS. 1 and 2, each MMI device will give rise to a comb-like transmittance spectrum 91, 92 as shown in FIGS. 5(a) and 5(b). The transmittance spectrum, 92 of the first MMI device, 34 has a free spectral range (FSR) (a comb spacing) which is different from the FSR, $FSR_2$ of the second MMI device, 35. This means that wavelength tuning may be achieved using the Vernier effect by altering the transmittance spectrum of one (or both) of the MMI devices relative to the other (each other) so that a given mode of the first transmittance spectrum overlaps with a given mode of the second transmittance spectrum. The transmittance spectrum, 91 of the first MMI device has a transmittance value of 0.8-1 and the transmittance spectrum, 92 of the second MMI device has a transmittance value of 0.8-1.

Figure 5:
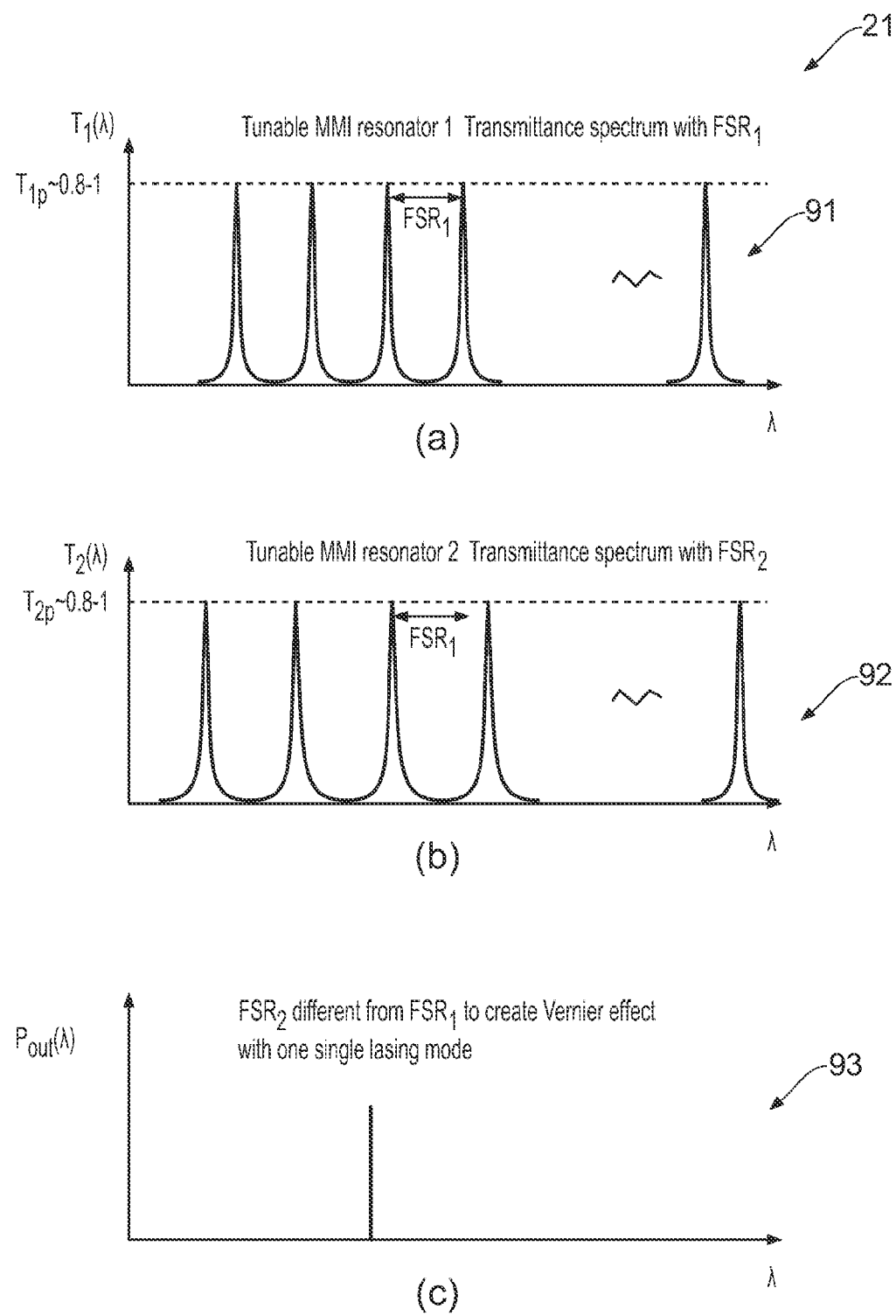
FIG. 5 shows transmittance spectra produced by (a) the first MMI device of the tunable laser shown in FIG. 1 or 2; (b) the second MMI device of the tunable laser shown in FIG. 1 or 2; and (c) the selected laser output mode.

The output spectrum, 93 of the laser will correspond to the sum of the two transmittance spectra which will therefore pick out the overlapped mode (shown as the third peak in FIG. 5).

Embodiments of the present invention relating to SOI lasers with ring resonators (RRs) are described below with reference to FIGS. 6 to 11.

Figure 6:
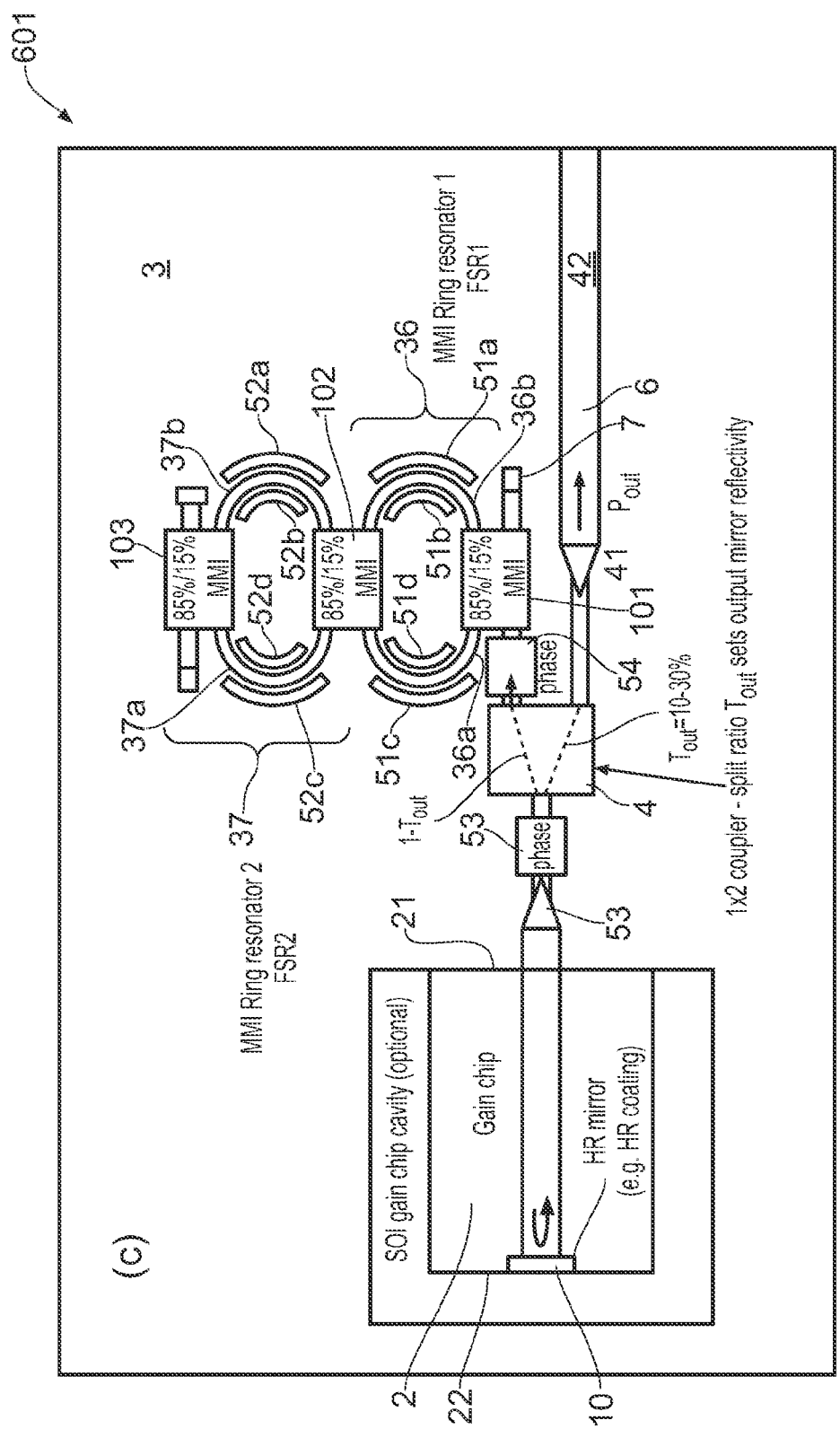
FIG. 6 shows a top-view schematic of a wavelength tunable laser according to the third, fourth and sixth aspects of the present invention.

FIG. 6 shows a wavelength tunable silicon-on-insulator (SOI) laser, 601 comprising a laser cavity, the laser cavity including a semiconductor gain medium, 2 and a phase-tunable waveguide platform 3. The semiconductor gain medium, 2 has a front end, 21 and a back end, 22 and the phase-tunable waveguide platform is coupled to said front end, 21. In the embodiment shown in FIG. 6, the semiconductor gain medium, 2 takes the form of a gain chip. The gain chip shown is located inside of an SOI gain chip cavity.

The phase-tunable waveguide platform includes a first ring resonator 36 having a first free spectral range ($FSR_1$) and a second ring resonator, 37 having a second free spectral range ($FSR_2$). In the embodiment shown in FIG. 6, both the first ring resonator and the second ring resonator are phase-tunable.

The first ring resonator cavity 36 is made up of a first half-ring 36a and a second half-ring 36b and the second ring resonator cavity 37 is also made up of a first half-ring 37a and a second half-ring 37b. In the wavelength tunable laser shown in FIG. 6, the half-ring structures are coupled to one another and to straight waveguides of the laser cavity using no more than 3 MMI couplers, 101, 102, 103.

The first MMI coupler couples light into the first ring resonator. It is a 2×2 MMI coupler with 2 back end ports and two front end ports. The back end ports comprise an input port for light from the gain medium and a port coupled to the first half-ring 36a of the first ring resonator 36. The front end ports comprise a port connected to an absorber/detector, 7 and a port coupled to the second half-ring 36b of the first ring resonator 36.

The second MMI coupler couples the first ring resonator 36 to the second ring resonator 37. It also takes the form of a 2×2 MMI coupler with 2 back end ports connected to the first ring-half 36a of the first ring resonator and the first ring-half 37a of the second ring resonator respectively; and two front end ports connected to the second ring-half 36b of the first ring resonator and the second ring-half 37b of the second ring resonator respectively. The direct coupling of the ring halves 36a, 36b of the first ring resonator to the ring halves 37a, 37b of the second ring resonator reduce the MMI related losses because only three MMIs are required (rather than the embodiments with four MMIs described below). The cavity length is also reduced. However, in such a design the Finesse values of the two ring resonators are coupled to one another by the second MMI coupler which leads to a reduction in design freedom.

The third MMI coupler couples light out of the second ring resonator to an output waveguide that forms a mirror of the laser cavity. It too takes the form of a 2×2 MMI coupler comprising two back end ports coupled to the first ring-half 37a of the second ring resonator and to a waveguide containing an absorber/detector 7 respectively; and two front end ports, one coupled to the second ring-half of the second ring resonator 37b, and the other to an output waveguide terminated by a reflective surface which forms a mirror of the laser cavity.

A 1×2 coupler, 4 is located between the gain medium and the ring resonators. The 1×2 coupler splits light between a first branch in which the ring resonators are located in series with one another, and a second branch which forms an output branch 6 of the laser. The split ratio of the 1×2 coupler is chosen to split 10-30% of light into the output branch.

Each phase-tunable ring resonator 36, 37 includes a phase tuning region. In the embodiment shown in FIG. 6, each half-ring 36a, 36b, 37a, 37b includes a single phase tuning region, which overlaps the width of the half-ring (shown in FIG. 6 by pairs of reference numbers: 51a and 51b for the first half-ring of the first ring resonator; 51c and 51d for the second half-ring of the first ring resonator; 52a and 52b for the first half-ring of the second ring resonator; and 52c and 52d for the second half-ring of the second ring resonator). The phase tuning region includes an electro-optical medium formed by a doping structure, and the doping structure may take the form of a p-i-n junction or a p-n junction.

The phase-tunable waveguide platform also includes a first additional phase tuning region, 53 and a second additional phase tuning region, 54, each being separate from the phase-tunable first and second ring resonators. These additional phase tuning regions provide fine tuning of the laser frequency. The first additional phase tuning region, 53 is located between the semiconductor gain medium and the 1×2 coupler whilst the second additional phase tuning region, 54 is located in the same branch of the cavity as the ring resonators, in-between the 1×2 coupler and the first 2×2 MMI coupler 101.

Also located between the semiconductor gain medium, 2 and the 1×2 coupler, 4 is a transition region, 41 in the form of a taper. At the transition region 41, the height and width of the waveguide platform changes from a first height and width to a second height and width, the first height and the first width being greater than the second height and the second width respectively. All phase-tunable regions shown in this embodiment are located at parts of the waveguide platform at which the waveguide has a reduced width and height.

Figure 7:
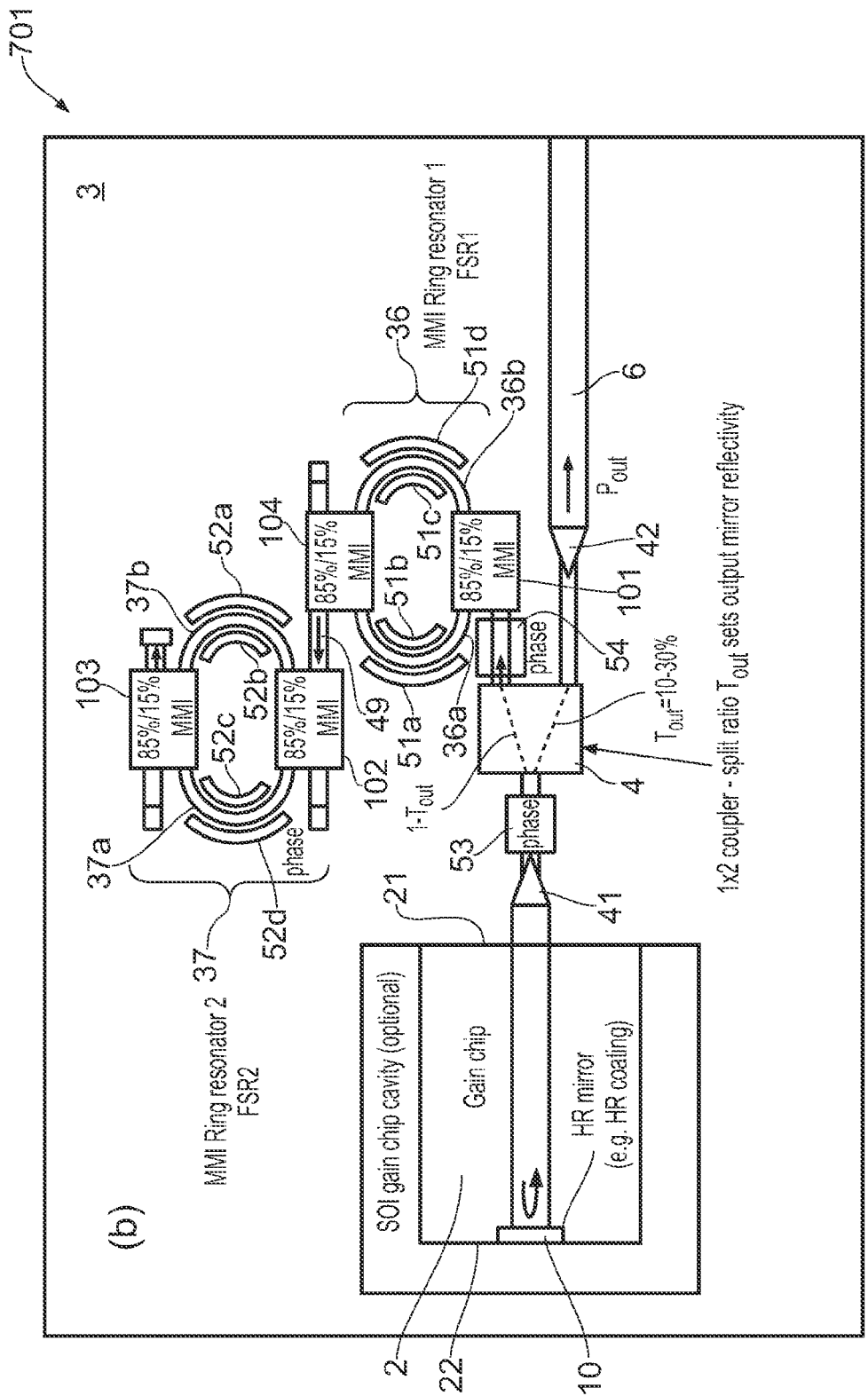
FIG. 7 shows a top-view schematic of an alternative wavelength tunable laser according to the third, fourth and sixth aspects of the present invention.

A second transition region, 42 is located at the output of the laser such that the output changes from a waveguide at a second (smaller) height and width to a first (larger) height and width. The larger height and width output of the laser is therefore of a size which is more advantageous when coupling to application components such as a gain chip and a single-mode fibre An example of the type of taper which forms both the first and second transition regions 41, 42 is discussed in more detail below in relation to FIG. 13. An alternative wavelength tunable laser is shown in FIG. 7 where like references have the same meaning as those described in relation to FIG. 6. The tunable laser shown in FIG. 7 differs from that shown in FIG. 6 in that it comprises an additional MMI coupler, i.e. there are a total of 4 MMI couplers directly coupled to half rings of the ring resonators. These comprise: A first multimode interference (MMI) coupler 101 located between the semiconductor gain medium 2 and the first ring resonator to couple light into the first ring resonator 36; A second MMI coupler 102 located between the first ring resonator 36 and the second ring resonator 37 to couple light into the second ring resonator; a third MMI coupler 103 located at the opposite side of the second ring resonator to the second MMI coupler 102 including a reflective surface to form a mirror of the laser cavity; and the additional fourth MMI coupler 104 which is also located between the first ring resonator 36 and the second ring resonator 37. The addition of the fourth MMI coupler between the ring halves of the first ring resonator and the ring halves of the second ring resonator increases the design freedom of the system relative to the design described in relation to FIG. 6. In the embodiment shown, other components including a 1×2 coupler, 4, additional phase tuning regions, 53, 54, transition region and various waveguides are located between the semiconductor gain medium and the first MMI coupler.

The second MMI coupler is coupled to the fourth MMI coupler via an intermediate waveguide, 49.

Figure 8:
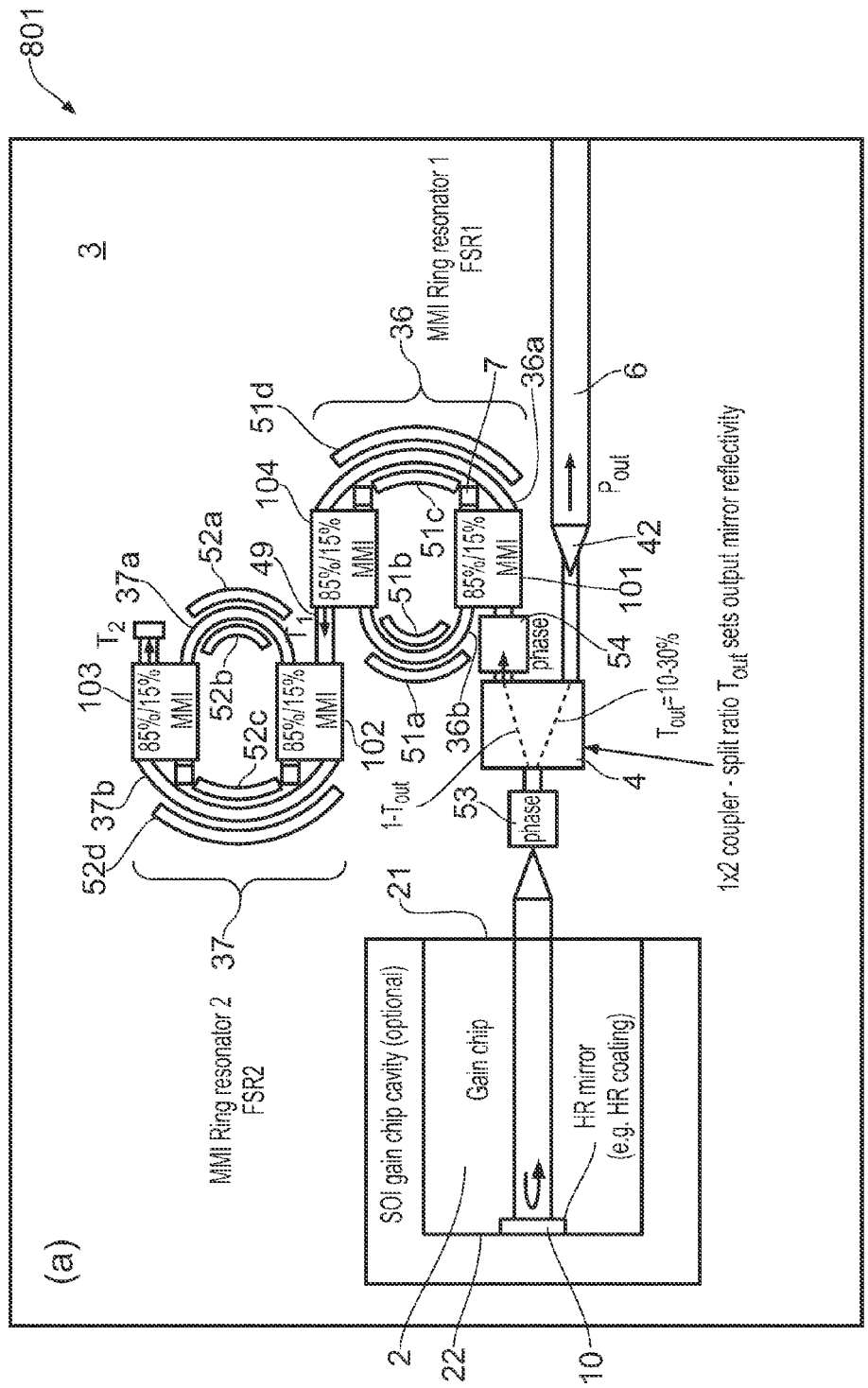
FIG. 8 shows a top-view schematic of a further alternative wavelength tunable laser according to the third, fourth and sixth aspects of the present invention.

An alternative wavelength tunable laser is shown in FIG. 8 where like references have the same meaning as those described in relation to FIGS. 6 and 7. FIG. 8 differs from that shown in FIG. 7 in that the first half-ring 36a of the first resonator has a larger radius of curvature than its second half-ring 36b and the first half-ring 37a of the second ring resonator has a smaller radius of curvature than its second half-ring 37b. As with the tunable laser of FIG. 7: A first multimode interference (MMI) coupler 101 is located between the semiconductor gain medium 2 and the first ring resonator to couple light into the first ring resonator 36; A second MMI coupler 102 is located between the first ring resonator 36 and the second ring resonator 37 to couple light into the second ring resonator; a third MMI coupler 103 is located at the opposite side of the second ring resonator to the second MMI coupler 102 which is coupled to an output waveguide which is terminated by a reflective surface to form a mirror of the laser cavity; and a fourth MMI coupler 104 is also located between the first ring resonator 36 and the second ring resonator 37. Again, in the embodiment shown, other components including a 1×2 coupler, 4, additional phase tuning regions, 53, 54, transition region and various waveguides are located between the semiconductor gain medium and the first MMI coupler and the second MMI coupler is coupled to the fourth MMI coupler via an intermediate waveguide, 49.

Since the ring-halves of each ring resonator have different radii of curvature, the MMI couplers and the half-rings of each ring resonator are arranged such that larger half-rings are coupled to outer ports of the MMI couplers and smaller half-rings are coupled to inner ports of the MMI couplers.

All ports that do not form part of connections mentioned above may be coupled to waveguides which terminate in absorbers or detectors.

In the embodiments shown in FIGS. 6, 7 and 8, all of the MMI couplers are 2×2 couplers as this simplifies fabrication.

For each of the wavelength tunable lasers described in relation to FIGS. 6 to 8, each ring resonator will give rise to a comb-like transmittance spectrum 94, 95 as shown in FIGS. 9(a) and 9(b) respectively. The transmittance spectrum, 94 of the first ring resonator, 36 has a free spectral range ($FSR_1$) (a comb spacing) which is different from the FSR, $FSR_2$ of the second ring resonator, 37. This means that wavelength tuning may be achieved using the Vernier effect by altering the transmittance spectrum of one (or both) of the ring resonators relative to the other (to each other) so that a given mode of the first transmittance spectrum overlaps with a given mode of the second transmittance spectrum. The transmittance spectrum, 94 of the first MMI device has a transmittance of 0.8-1 and the transmittance spectrum, 95 of the second MMI device has a transmittance of 0.8-1.

Figure 9:
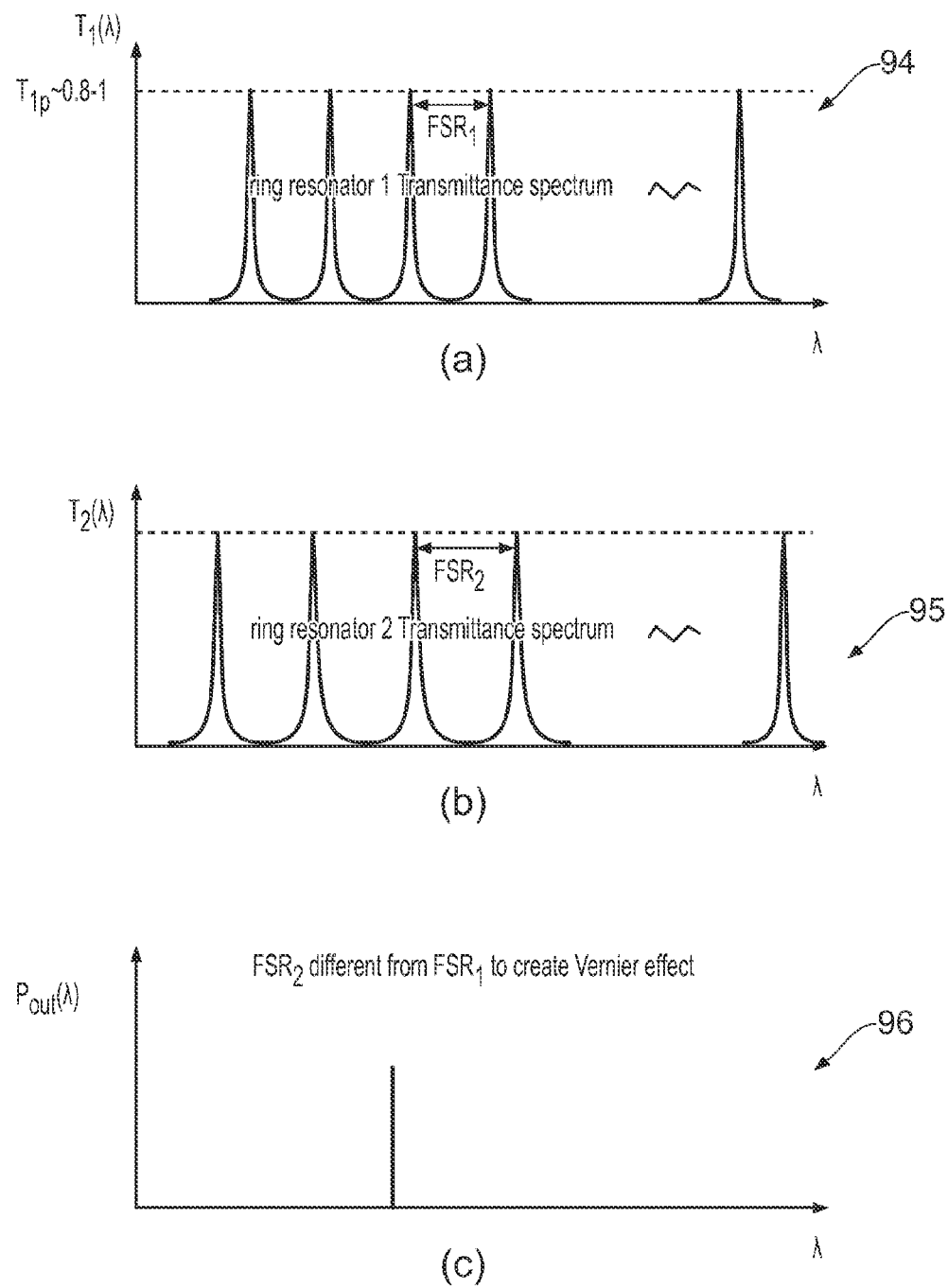
FIG. 9 shows transmission spectra produced by (a) the first ring resonator of the tunable laser shown in any one of FIGS. 6 to 8; (b) the second ring resonator of the tunable laser shown in any one of FIGS. 6 to 8; and (c) the selected laser output mode.

The output spectrum, 96 of the laser will correspond to the sum of the two transmittance spectra which will therefore pick out the overlapped mode (shown as the third peak in FIG. 9).

In an alternative embodiment (not shown), the arrangement shown in each of FIGS. 6-8 could be adapted in that the taper could be moved to the top waveguide arm after the 1×2 coupler. In this way, a second taper at the output would not be needed. All of the phase tunable MMI devices would be in the reduced width and height regions, but additional "fine-tuning" phase tuning regions could be in the larger waveguides as they are low speed devices.

Figure 10:
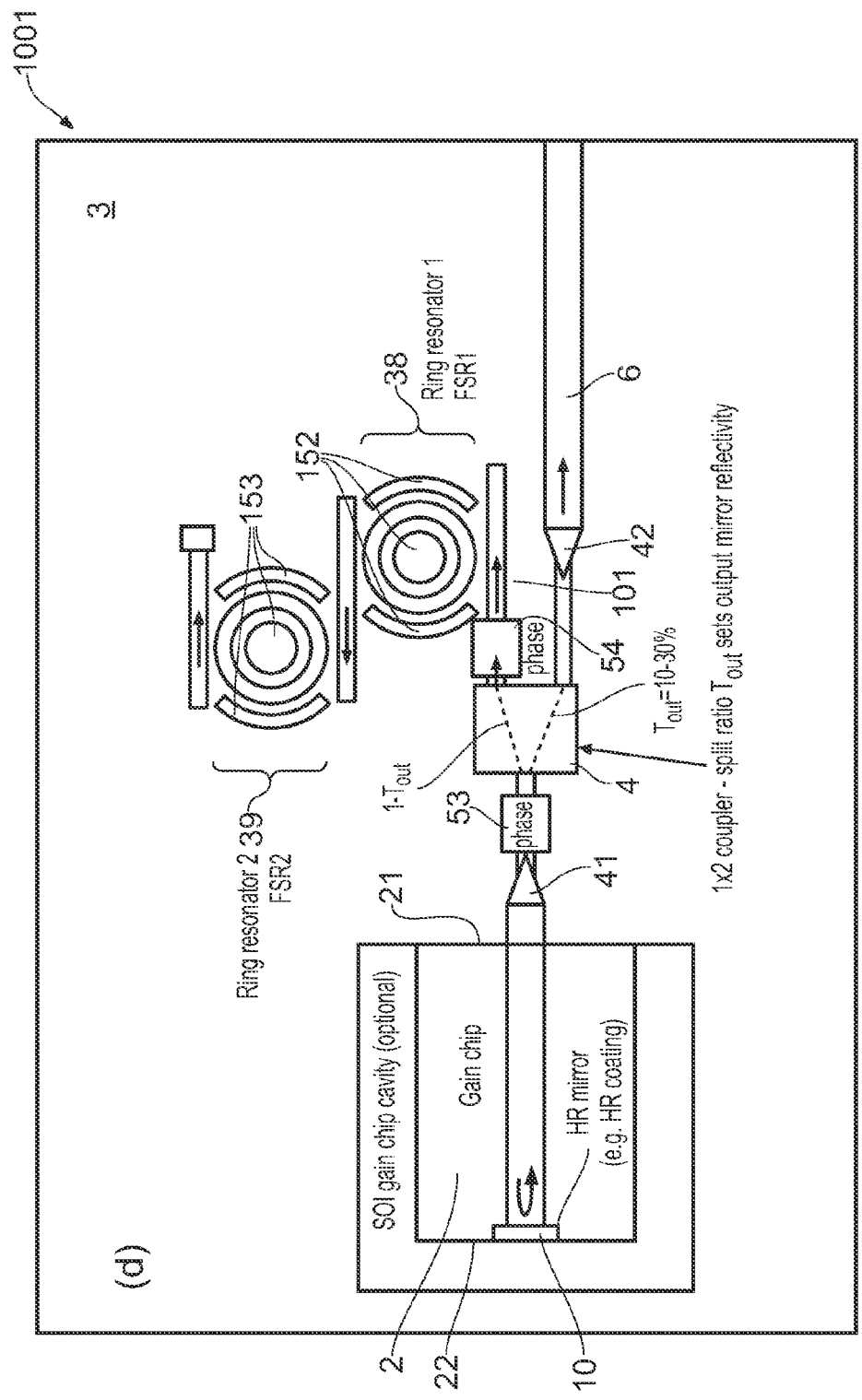
FIG. 10 shows a top-view schematic of a wavelength tunable laser according to the fourth and sixth aspects of the present invention.
Figure 11:
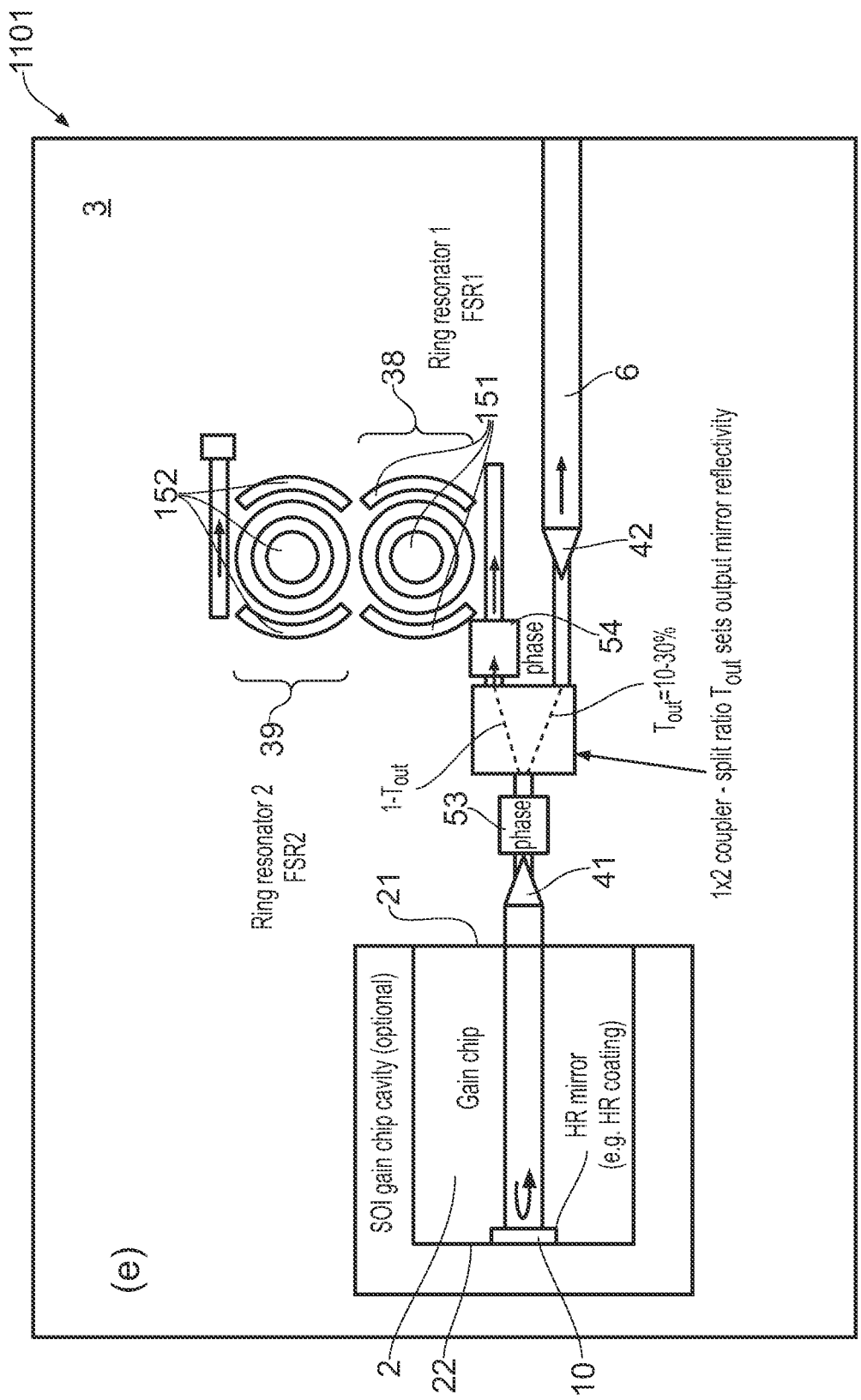
FIG. 11 shows a top-view schematic of an alternative wavelength tunable laser according to the fourth and sixth aspects of the present invention.

FIGS. 10 and 11 disclose alternative ring resonator based wavelength tunable lasers 1001, 1101 where like references have the same meaning as those described in relation to FIGS. 6 to 8. As with the previous ring resonator lasers, the laser cavity includes a semiconductor gain medium, 2 and a phase-tunable waveguide platform 3. The semiconductor gain medium, 2 has a front end, 21 and a back end, 22 and the phase-tunable waveguide platform is coupled to said front end, 21. In the embodiment shown in FIGS. 10 and 11, the semiconductor gain medium, 2 takes the form of a gain chip. The gain chip shown is located inside of an SOI gain chip cavity.

The phase-tunable waveguide platform includes a first ring resonator 38 having a first free spectral range ($FSR_1$) and a second ring resonator, 39 having a second free spectral range ($FSR_2$). Both ring resonators are phase tunable because they each include a phase-tunable region, 152, 153 (as described elsewhere in this document). The tunable lasers shown in FIGS. 10 and 11 differ from those shown in FIGS. 6 to 8 in that both the first ring resonator and the second ring resonator are circular (or racetrack) waveguides. All other features such as the gain chip, 2; mirror, 10; additional phase tuning regions, 53, 54; transition regions, 41, 42; output 6; and 1×2 coupler 4; are as described above in relation to FIGS. 6 to 8.

In the embodiment of a wavelength tunable laser 1001 shown in FIG. 10, light is coupled into the first circular ring resonator 38 via a straight waveguide of the waveguide platform which is directly coupled to the first ring resonator. A further straight waveguide couples light between the first circular ring resonator 38 and the second circular ring resonator 39. A third straight waveguide couples a mirror of the laser cavity to the opposite side of the second ring resonator to the first ring resonator.

The wavelength tunable laser of FIG. 11 differs from that of FIG. 10 in that the first ring resonator is directly coupled to the second ring resonator.

The use of more traditional circular ring resonators coupled directly to each other and/or to straight waveguides in the waveguide platform (rather than via MMI couplers) advantageously minimises the ring size, offers the highest flexibility in terms of possible FSR values, and maximizes the open waveguide space for p-i-n or p-n junctions in the phase tuning regions. However, this is at a cost of lower fabrication tolerances and increased complexity for high yield manufacturing.

Figure 12:
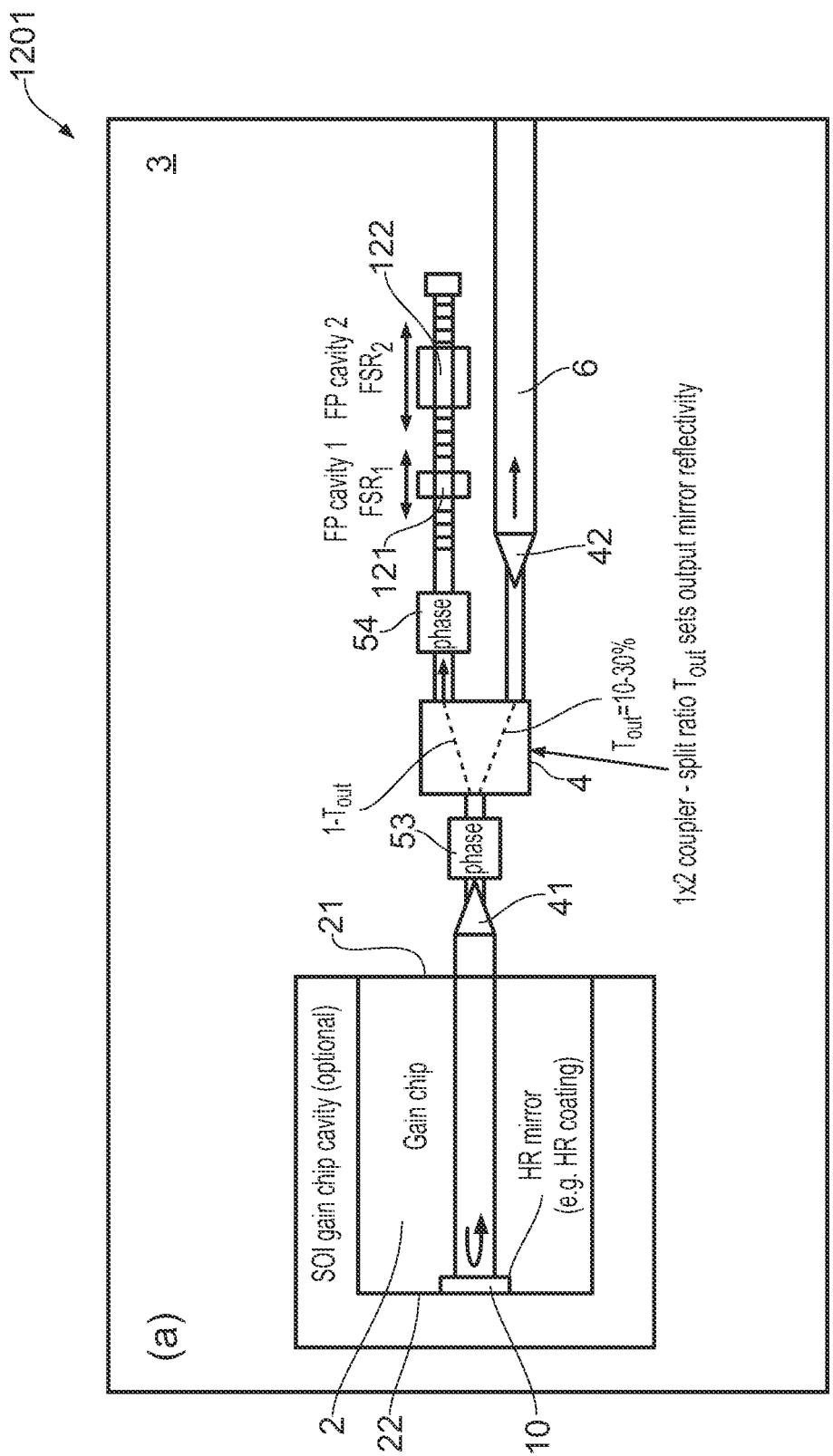
FIG. 12 shows a top-view schematic of a further alternative wavelength tunable laser according to the fifth and sixth aspect of the present invention.

FIG. 12 discloses an example of a wavelength tunable silicon-on-insulator laser 1201 with a coupled Fabry-Perot resonator scheme of two Fabry-Perot filters. The laser comprises a laser cavity having a semiconductor gain medium, 2 (having a front end and a back end) and a phase-tunable waveguide platform, 3 coupled to the front end of the semiconductor gain medium. In the embodiment shown in FIG. 12, the semiconductor gain medium, 2 takes the form of a gain chip which is located inside of an SOI gain chip cavity.

The phase-tunable waveguide platform includes a first waveguide Fabry-Perot filter, 121 and a second waveguide Fabry-Perot filter, 122 in a series arrangement with one another. In the embodiment shown, both Fabry-Perot filers are tunable as they each include a phase tuning region.

All other features of the waveguide platform such as the gain chip 2; mirror, 10; additional phase tuning regions, 53, 54; transition regions, 41, 42; output 6; and 1×2 coupler 4; are as described above in relation to FIGS. 2 to 4, 6 to 8, and 10 to 13.

In the laser design shown in FIG. 12, the two compact cavities of the Fabry-Perot filters are formed by three broadband DBR reflectors. This design provides for a shorter cavity length, lower losses and lower power consumption. However, the fabrication and design complexity is high due to the need to incorporate three DBR gratings with potentially short lengths and deeply etched grating corrugations.

The three DBR reflectors (gratings) can be made with a small number of grating lines as only a very broad bandwidth is required. In one embodiment (not shown), the three DBR reflectors contain just one grating line per reflector (i.e. a single waveguide defect) such that each defect acts as a broadband mirror (deeply etched and width optimized to produce a sufficiently high reflectivity).

In another embodiment (not shown) the transition region described in relation to FIG. 12 could be moved to the top waveguide, after the 1×2 coupler but before the first Fabry-Perot mirror.

Figure 13:
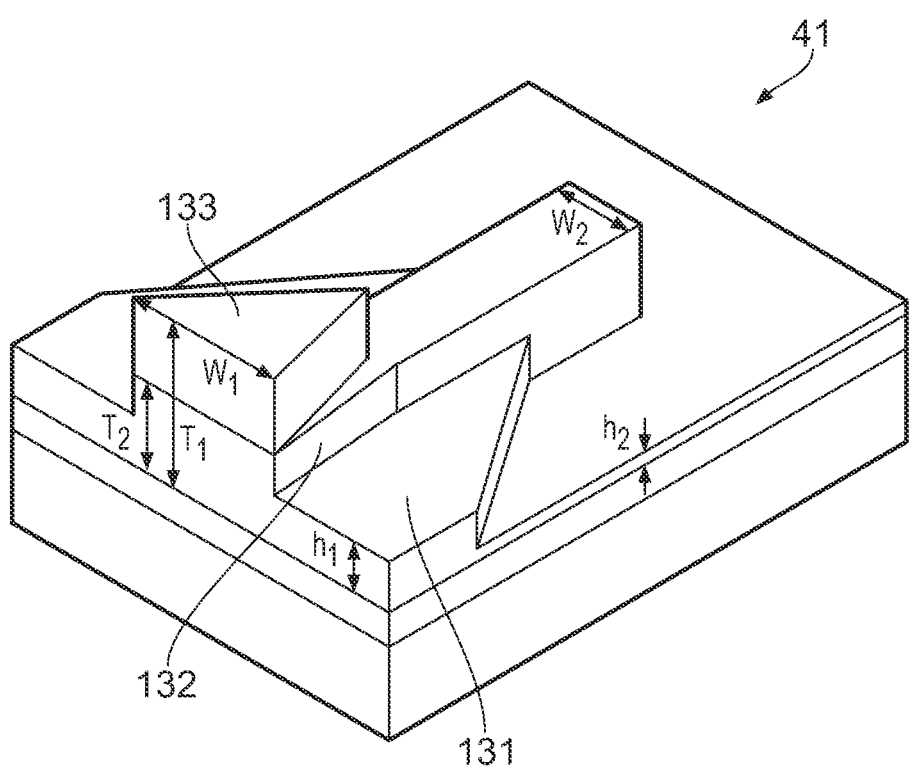
FIG. 13 shows a schematic of a transition region.

FIG. 13 shows an example of a first or second transition region in the form of a taper as present in each of FIGS. 1 to 4, 6 to 8, and 10 to 13. The taper couples a larger waveguide of a first height and width to a smaller waveguide of a second height and width so acts as both a "vertical taper" and a lateral taper. It comprises: a lower portion, 131 having a base "wedge-shaped" portion with laterally tapered sides that taper a portion of the first slab region, up to the second width (the width, $w_2$ of the smaller waveguide); an intermediate portion, 132 which tapers the portion of the ridge above the first slab laterally from the larger waveguide width, $w_1$ to the smaller waveguide width, $w_2$; and an upper "wedge" portion, 133 formed on top of the intermediate portion which tapers the portion of the ridge of the first height remaining above the second height to a point. The relative dimensions of the upper, intermediate and lower portions are chosen to maximise the coupling of light from the larger waveguide to the smaller waveguide in both a lateral and vertical direction relative to the waveguide platform.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention. In particular, it is noted that the various resonators of the embodiments described throughout the application could be interchanged as defined by claim 70. In addition, where possible, a resonator could be replaced by a distributed Bragg grating reflector (DBR).

Where a laser cavity includes a transition region, any additional phase tuning regions as described above may be located at regions of the first height/width or second height/width as the speed of operation of these is not critical. Thus, one or more of the additional phase tuning regions could be replaced by one or more thermal tuning regions. Additional phase tuning regions are beneficial in compensating for thermal laser drift.

Throughout this document, tuning via the "Vernier" effect should be understood to cover continuous wavelength tuning, discontinuous wavelength tuning and/or quasi continuous wavelength tuning. The Vernier effect arises where the transmittance or reflectance spectrum of a first resonator or reflector of the laser cavity has a peak-to-peak spacing which is different from the peak-to-peak spacing of the transmittance or reflectance spectrum of a second resonator or reflector of the laser cavity. For continuous tuning it is necessary for both the first and the second resonator/reflector to be phase tunable. Discontinuous tuning can be achieved via phase tuning of just one resonator/reflector. In this case, the output wavelength of the laser cavity will be limited to discrete values set by the remaining (non-tunable) resonator/reflector.

All references referred to above are hereby incorporated by reference.

The invention claimed is:

1. A wavelength tunable silicon-on-insulator (SOI) laser comprising:
   a laser cavity including:
   a semiconductor gain medium having a front end and a back end; and
   a phase-tunable waveguide platform coupled to the front end of the semiconductor gain medium, the phase-tunable waveguide platform comprising:
   a first ring resonator having a first free spectral range (FSR);
   a second ring resonator having a second FSR different to the first FSR, the second ring resonator being coupled to the first ring resonator;
   wherein, at least one of the ring resonators is a phase-tunable ring resonator
   wherein each of the first ring resonator and the second ring resonator comprises a first half-ring and a second half-ring, the first half-ring coupled to the second half-ring; and
   wherein the laser cavity further comprises a multimode interference (MMI) coupler to couple light into the first ring resonator, the MMI also forms an optical couple between the first half-ring of the first ring resonator and the second half-ring of the first ring resonator.

2. The wavelength tunable laser of claim 1, wherein a mirror of the laser cavity is located at the back end of the semiconductor gain medium.

3. The wavelength tunable laser of claim 1, further comprising a second MMI coupler to couple light into the second ring resonator; wherein the second MMI also forms a further optical couple between the first half-ring of the first ring resonator and the second half-ring of the first ring resonator.

4. The wavelength tunable laser of claim 3, further comprising a third MMI coupler to couple light out of the second ring resonator, wherein the third MMI coupler also forms a mirror of the laser cavity as well as an optical couple between the first half-ring of the second ring resonator and the second half-ring of the second ring resonator.

5. The wavelength tunable laser of claim 3, wherein the second MMI coupler also forms an optical couple between the first half-ring of the second ring resonator and the second half-ring of the second ring resonator to directly couple the first ring resonator to the second ring resonator.

6. The wavelength tunable laser of claim 3, wherein the phase-tunable waveguide platform further comprises an additional 1×2 MMI coupler to couple light out of the first ring resonator.

7. A wavelength tunable silicon-on-insulator (SOI) laser comprising:
   a laser cavity including:
   a semiconductor gain medium having a front end and a back end; and
   a phase-tunable waveguide platform coupled to the semiconductor gain medium, the phase-tunable waveguide platform comprising:
   a first ring resonator having a first free spectral range (FSR);
   a second ring resonator having a second FSR different from the first FSR, the second ring resonator being coupled to the first ring resonator;
   wherein, at least one of the ring resonators is a phase-tunable ring resonator;
   wherein a mirror of the laser cavity is located at the back end of the semiconductor gain medium; and
   wherein each of the first ring resonator and the second ring resonator comprises a first half-ring and a second half-ring, the first half-ring coupled to the second half-ring by multimode interference couplers.

8. The wavelength tunable laser of claim 1, wherein each ring resonator comprises a first half-ring with a first radius of curvature coupled to a second half-ring with a second radius of curvature, the second radius of curvature being less than the first radius of curvature.

9. The wavelength tunable laser of claim 8, wherein the first half-ring and second half-ring are coupled to one another via a multimode interference coupler.

10. The wavelength tunable laser of claim 1, wherein the phase-tunable ring resonator includes a phase tuning region which comprises an electro-optical medium.

11. The wavelength tunable laser of claim 1, wherein the phase-tunable ring resonator includes a phase tuning region which comprises a p-i-n junction region.

12. The wavelength tunable laser of claim 1, wherein the phase-tunable ring resonator includes a phase tuning region which comprises a p-n junction region.

13. The wavelength tunable laser of claim 1, wherein both the first ring resonator and the second ring resonator are tunable ring resonators.

14. The wavelength tunable laser of claim 13,
   wherein the phase tuning region of the first ring resonator is any one of: a p-n junction; p-i-n junction or electro-optical medium; and
   wherein the phase tuning region of the second ring resonator is any one of: a p-n junction, p-i-n junction or electro-optical medium.

15. The wavelength tunable laser of claim 1, wherein the phase-tunable waveguide platform includes bifurcated waveguides, each arm of the bifurcated waveguides comprising one ring resonator.

16. The wavelength tunable laser of claim 15, wherein a bifurcated waveguide of the bifurcated waveguides is a Y-branch waveguide.

17. The wavelength tunable laser of claim 1, wherein the first ring resonator and second ring resonator are fabricated in a nested configuration.

18. The wavelength tunable laser of claim 1; further comprising a phase tuning region which is separate from the first and second ring resonators.

19. The wavelength tunable laser of claim 18, wherein one or more of said phase tuning region(s) comprise(s) an electro-optical medium.

20. The wavelength tunable laser of claim 18, wherein one or more of said phase tuning region(s) include(s): a p-n junction or a p-i-n junction.

21. The wavelength tunable laser of claim 1, wherein the phase-tunable waveguide platform comprises at least one transition region at which a waveguide of a first height is coupled to a waveguide of a second height; the second height being less than the first height.

22. The wavelength tunable laser of claim 21, wherein at least one of the first and second ring resonators is located in a waveguide of a second height.

23. The wavelength tunable laser of claim 1, wherein the phase-tunable waveguide platform comprises a transition region at which a waveguide of a first width is coupled to a waveguide of a second width; the second width being less than the first width.

24. The wavelength tunable laser of claim 23, wherein at least one of the first and second ring resonators is located in a waveguide of said second width.

25. The wavelength tunable laser of claim 21, wherein the transition region includes a taper or a mode transformer.

* * * * *